US012677575B2

(12) United States Patent
Woo et al.

(10) Patent No.: US 12,677,575 B2
(45) Date of Patent: Jul. 7, 2026

(54) DISPLAY DEVICE

(71) Applicant: Samsung Display Co., Ltd., Yongin-Si (KR)

(72) Inventors: Junhyuk Woo, Yongin-si (KR); Minhee Son, Yongin-si (KR); Yong Seok Kim, Yongin-si (KR); Saet Byeol Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 397 days.

(21) Appl. No.: 18/213,901

(22) Filed: Jun. 26, 2023

(65) Prior Publication Data

US 2024/0097086 A1 Mar. 21, 2024

(30) Foreign Application Priority Data

Sep. 19, 2022 (KR) ........................ 10-2022-0117646

(51) Int. Cl.
H10K 59/80 (2023.01)
B60K 35/23 (2024.01)

(52) U.S. Cl.
CPC ......... H10K 59/879 (2023.02); H10K 59/875 (2023.02); B60K 35/23 (2024.01)

(58) Field of Classification Search
CPC .................. H10K 59/875–879; H10K 59/8792
See application file for complete search history.

(56) References Cited

U.S. PATENT DOCUMENTS

| | | | |
|---|---|---|---|
| 11,073,914 B2 | 7/2021 | Kim et al. | |
| 11,489,145 B2 | 11/2022 | Bae et al. | |
| 2018/0156955 A1 | 6/2018 | Diao et al. | |
| 2020/0161395 A1 | 5/2020 | Kim et al. | |
| 2020/0161579 A1* | 5/2020 | Kim | H10K 59/126 |
| 2021/0036263 A1 | 2/2021 | Kim et al. | |
| 2023/0217794 A1* | 7/2023 | Kim | H10K 59/8792 |
| | | | 349/33 |
| 2024/0057459 A1* | 2/2024 | Jung | H10K 59/878 |
| 2024/0298506 A1* | 9/2024 | Lee | H10K 59/873 |

FOREIGN PATENT DOCUMENTS

| | | | | |
|---|---|---|---|---|
| EP | 4207985 A2 | 7/2023 | | |
| KR | 10-1983065 B1 | 5/2019 | | |
| KR | 10-2020-0083208 A | 7/2020 | | |
| KR | 10-2021-0008265 A | 1/2021 | | |
| KR | 10-2023-0104506 A | 7/2023 | | |
| WO | WO-2020141650 A1 * | 7/2020 | ........... | H10K 59/873 |

* cited by examiner

*Primary Examiner* — Mariceli Santiago
(74) *Attorney, Agent, or Firm* — Innovation Counsel LLP

(57) ABSTRACT

A display device is disclosed that includes a substrate including light emitting areas and a peripheral area surrounding the light emitting areas, a light emitting element layer disposed on the substrate and overlapping the light emitting areas, an encapsulation layer disposed on the light emitting element layer and a first pattern layer disposed on the encapsulation layer, and including first extension parts extending in a first direction and first connection parts connecting adjacent first extension parts among the first extension parts to each other.

15 Claims, 35 Drawing Sheets

100:100A,100B,100C,100D

PTL1

EXT1

XI                                                                    XI'

LA

PA

ASB2

XVI ← → XVI

DR1

DR2

ASB: ASB1, ASB2

ASB: ASB1, ASB2

FIG. 37

F I G. 38
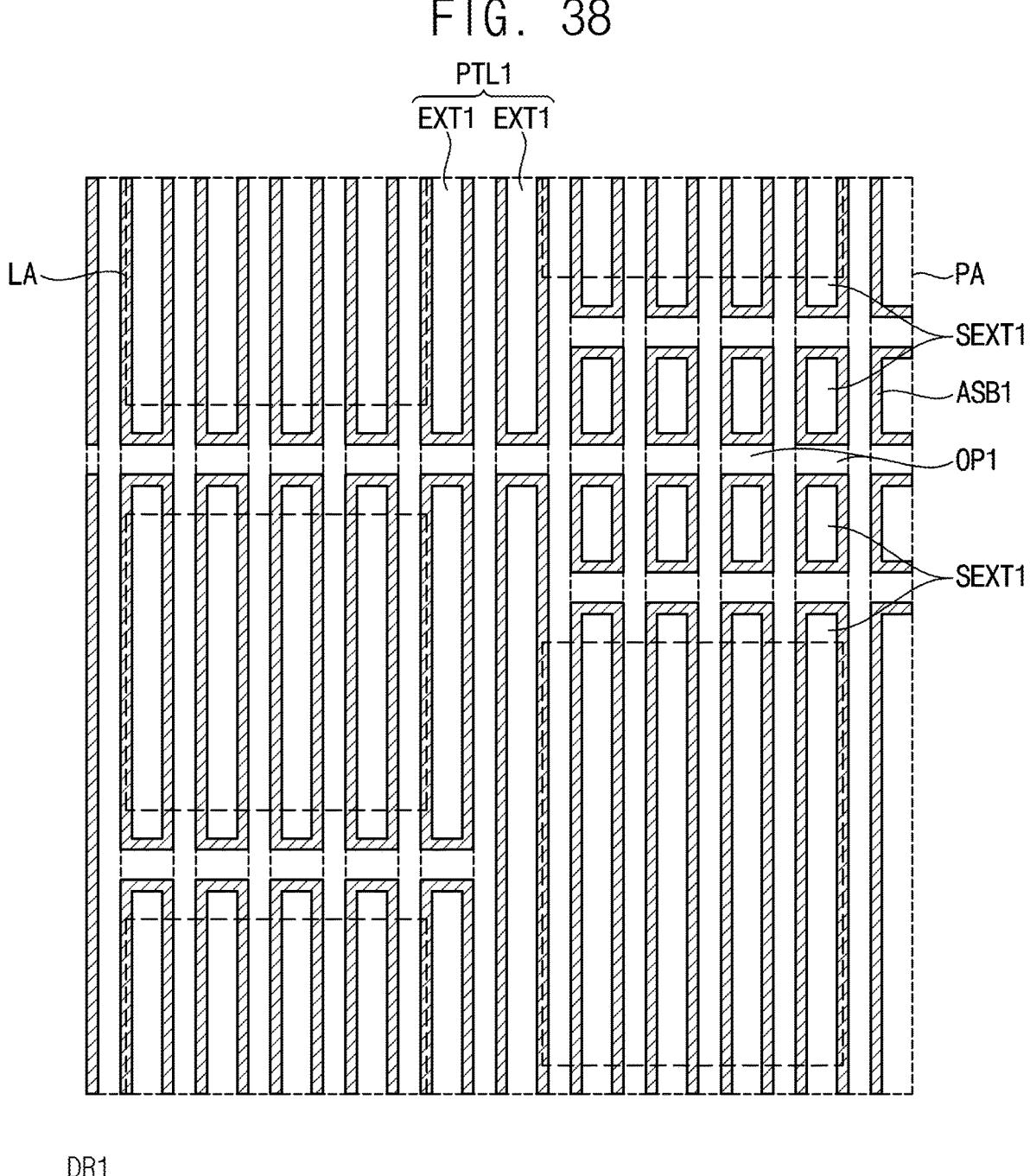

DISPLAY DEVICE

CROSS-REFERENCE TO RELATED APPLICATION(S)

This application claims priority under 35 USC § 119 to Korean Patent Application No. 10-2022-0117646 filed on Sep. 19, 2022 in the Korean Intellectual Property Office (KIPO), the entire disclosure of which is incorporated by reference herein.

BACKGROUND

1. Field

The present disclosure relates to a display device. More particularly, the present disclosure relates to a display device including a viewing angle adjusting function.

2. Description of the Related Art

A display device is an electronic device that provides visual information to a user. As, thickness and weight of display devices has decreased, the uses of display devices have diversified.

A vehicle is currently one of the widely used means of transportation. A vehicle display device for providing various functions has become common. The vehicle display device may provide speed information, map information, and driving information to a driver or provide entertainment information to a passenger.

Meanwhile, at night, an image displayed on the vehicle display device disposed in front of a driver or passenger may be reflected on a windshield. In this case, the image reflected on the windshield may interfere with the driver's ability to drive. In addition, when an image viewed by a passenger through the vehicle display device is exposed to the driver, it may interfere with the driver's ability to drive.

SUMMARY

Embodiments may provide a display device with improved reliability.

A display device according to an embodiment may include a substrate including light emitting areas and a peripheral area surrounding the light emitting areas, a light emitting element layer disposed on the substrate and overlapping the light emitting areas, an encapsulation layer disposed on the light emitting element layer and a first pattern layer disposed on the encapsulation layer, and including first extension parts extending in a first direction and first connection parts connecting adjacent first extension parts among the first extension parts to each other.

In an embodiment, the first connection parts may be spaced apart from the light emitting areas in a plan view and disposed in the peripheral area.

In an embodiment, the first extension parts and the first connection parts may be disposed on the same layer and integrally formed.

In an embodiment, the first connection parts may extend in a second direction crossing the first direction.

In an embodiment, the display device may further include a second pattern layer disposed on the encapsulation layer and adjacent to the first pattern layer.

In an embodiment, the second pattern layer may include second extension parts disposed between the first extension parts and extending in the first direction and second connection parts connecting adjacent second extension parts among the second extension parts to each other.

In an embodiment, a height of each of the second extension parts may be greater than a height of each of the first extension parts.

In an embodiment, in a plan view, the first extension parts and the second extension parts may be alternately disposed.

In an embodiment, the second extension parts and the second connection parts may be disposed on the same layer and integrally formed.

In an embodiment, the second extension parts may respectively cover the first connection parts and respectively overlap the first connection parts.

In an embodiment, the second connection parts may be respectively disposed on the first extension parts and respectively overlap the first extension parts.

In an embodiment, the second connection parts may be disposed in the peripheral area and extend in a second direction crossing the first direction.

In an embodiment, the first connection parts and the second connection parts may overlap each other in the second direction.

In an embodiment, the first connection parts and the second connection parts may be alternately disposed along the second direction.

In an embodiment, the display device may further include a light absorption film covering a side surface of each of the first extension parts and the second extension parts.

In an embodiment, the light absorption film may cover side surfaces of the first connection parts and the second connection parts.

In an embodiment, the light absorption film may include molybdenum-tantalum oxide (MTO).

In an embodiment, the first pattern layer may be formed of at least one of an acrylic-based resin, a methacrylic-based resin, a polyisoprene-based resin, a vinyl-based resin, an epoxy-based resin, an urethane-based resin, a cellulose-based resin, a siloxane-based resin, a polyimide-based resin, a polyamide-based resin, and a perylene-based resin.

A display device according to an embodiment may include a substrate including light emitting areas and a peripheral area surrounding the light emitting areas, a light emitting element layer disposed on the substrate and overlapping the light emitting areas, an encapsulation layer disposed on the light emitting element layer and a first pattern layer disposed on the encapsulation layer and including first extension parts extending in a first direction and defining at least one first opening.

In an embodiment, the first opening may be spaced apart from the light emitting areas in a plan view, and defined in the peripheral area.

In an embodiment, each of the first extension parts may include first sub-extension parts spaced apart from each other by the first opening.

In an embodiment, the display device may further include a second pattern layer disposed on the encapsulation layer and adjacent to the first pattern layer.

In an embodiment, the second pattern layer may include second extension parts disposed between the first extension parts, extending in the first direction, and defining at least one second opening.

In an embodiment, a height of each of the second extension parts may be greater than a height of each of the first extension parts.

In an embodiment, in a plan view, the first extension parts and the second extension parts may be alternately disposed.

In an embodiment, the first opening and the second opening may overlap each other in a second direction crossing the first direction.

In an embodiment, the first opening and the second opening may be alternately disposed along a second direction crossing the first direction.

In an embodiment, each of the second extension parts may include second sub-extension parts spaced apart from each other by the second opening.

In an embodiment, the display device may further include a light absorption film covering side surfaces of the first sub-extension parts and the second sub-extension parts.

In an embodiment, the display device may further include a planarization film disposed on the first pattern layer and the second pattern layer and filling the first opening and the second opening.

In a display device according to embodiments of the present disclosure, as the first pattern layer includes the first connection parts and the second pattern layer includes the second connection parts, the first extension parts may be connected to each other by the first connection parts and the second extension parts may be connected to each other by the second connection parts. That is, since the first connection parts connect the first extension parts and the second connection parts connect the second extension parts, separation or loss of the first extension parts and the second extension parts may be prevented. Accordingly, reliability of the display device may be improved.

In addition, since the first openings are defined in the first pattern layer and the second openings are defined in the second pattern layer, the first extension parts may be separated into the plurality of first sub-extension parts by the first openings and the second extension parts may be separated into the plurality of second sub-extension parts by the second openings. Since the first openings partially cut off the first extension parts and the second openings partially cut off the second extension parts, all of the first extension parts and the second extension parts may not be torn off at once when some of the first extension parts and the second extension parts are torn off. That is, separation or loss of the first extension parts and the second extension parts may be prevented. Accordingly, reliability of the display device may be improved.

BRIEF DESCRIPTION OF THE DRAWINGS

FIGS. 19, 20, 21, 22, 23, 24, 25, 26, 27, 28, 29, 30, 31, 32, 33, 34, 35, and 36 are views illustrating a method of manufacturing a light control layer according to an embodiment of the present disclosure.

FIGS. 37, 38, 39, and 40 are views illustrating a method of manufacturing a light control layer according to an embodiment of the present disclosure.

DETAILED DESCRIPTION OF THE EMBODIMENTS

Figure 1:
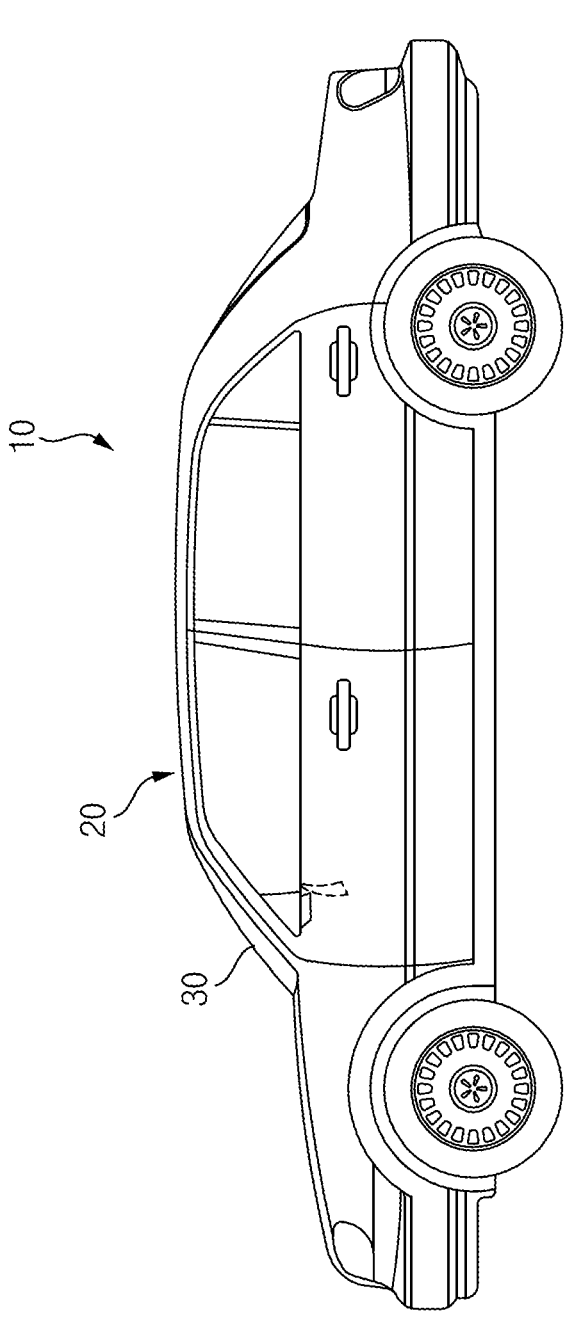
FIG. 1 is a side view showing a vehicle according to an embodiment of the present disclosure.

Hereinafter, display devices in accordance with embodiments will be described in more detail with reference to the accompanying drawings. The same reference numerals are used for the same components in the drawings, and redundant descriptions of the same components will be omitted.

Figure 2:
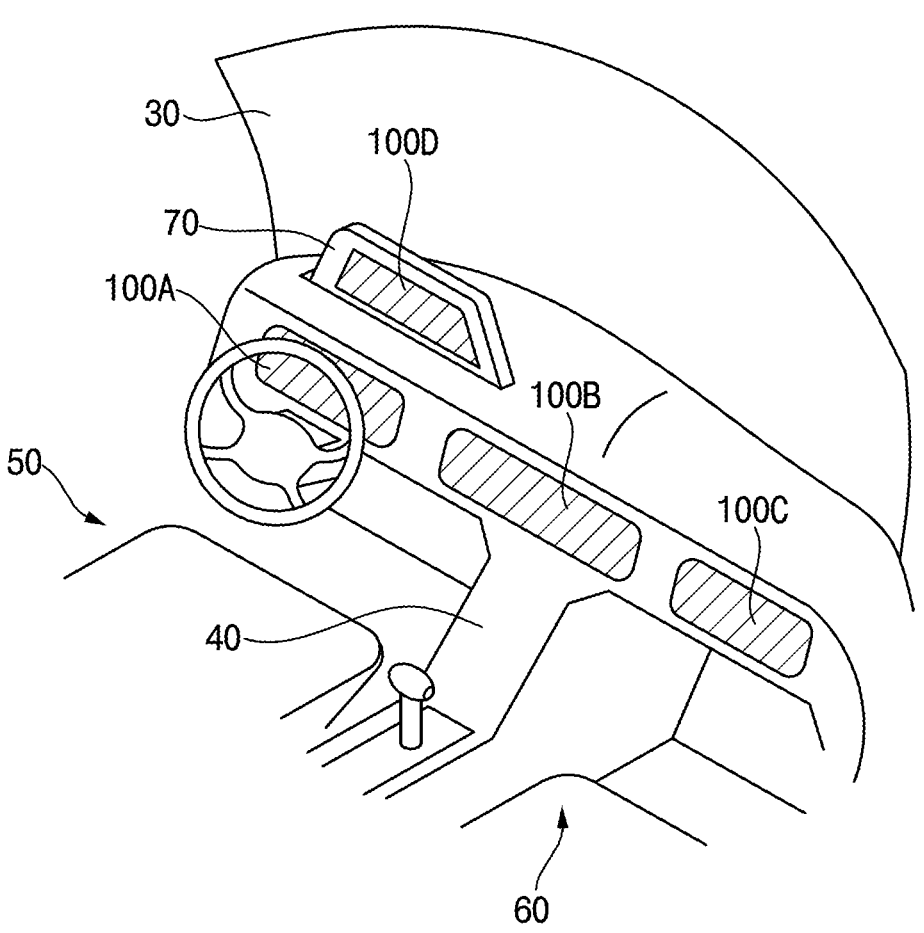
FIG. 2 is a view showing an interior space of the vehicle of FIG. 1.

FIG. 1 is a side view showing a vehicle according to an embodiment of the present disclosure. FIG. 2 is a view showing an interior space of the vehicle of FIG. 1.

Referring to FIGS. 1 and 2, a vehicle 10 according to an embodiment may include a vehicle body 20 and a vehicle display device 100 (hereinafter, also referred to as a display device). The vehicle body 20 may form an exterior of the vehicle 10 and may define an interior space in which the driver and passengers board. The vehicle body 20 may include a windshield 30 that protects a driver and a passenger from the outside and provides the driver with a view. The display device 100 may be disposed in the interior space.

In an embodiment, the display devices 100A, 100B, and 100C may be disposed on a dashboard 40 provided in the interior space. For example, the display device 100A may be disposed on the dashboard 40 in front of a driver's seat 50 to provide speed information to the driver, and the display device 100B may be disposed on a center of the dashboard 40 to provide map information and the like. In addition, the display device 100C may be disposed on the dashboard 40 in front of a passenger seat 60 to provide entertainment information to a passenger.

Also, the display device 100D may be included in a head-up vehicle display 70. The head-up vehicle display 70 may be disposed on the dashboard 40. For example, the display device 100D may provide the driver with information helpful for driving.

In an embodiment, the display device 100C disposed on the dashboard 40 may adjust a viewing angle according to a mode. The display device 100C may display an image in a wide viewing angle mode or a narrow viewing angle mode. For example, the wide viewing angle mode may mean a state in which the viewing angle of the display device 100C is wide. In the wide viewing angle mode, an image may be displayed to the driver in the driver's seat 50 as well as the passenger in the passenger seat 60. Therefore, both the passenger and the driver may view the image of the display device 100C. In contrast, the narrow viewing angle mode may mean a state in which the viewing angle of the display device 100C is narrow. In the narrow viewing view mode, an image may be displayed only to a passenger in the passenger seat 60, and may not be displayed to a driver in the driver's seat 50. Therefore, only the passenger may view the image of the display device 100C.

Although the display device 100C disposed on the dashboard 40 has been described as a reference, the present disclosure is not limited thereto and may be similarly applied to the display devices 100A, 100B, and 100D.

In addition, the present disclosure is not limited thereto, and the display device 100 may also be disposed on the windshield 30.

Figure 3:
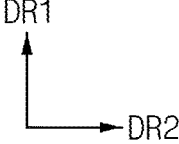
FIGS. 3 and 4 are plan views illustrating a display device according to an embodiment of the present disclosure.
Figure 4:
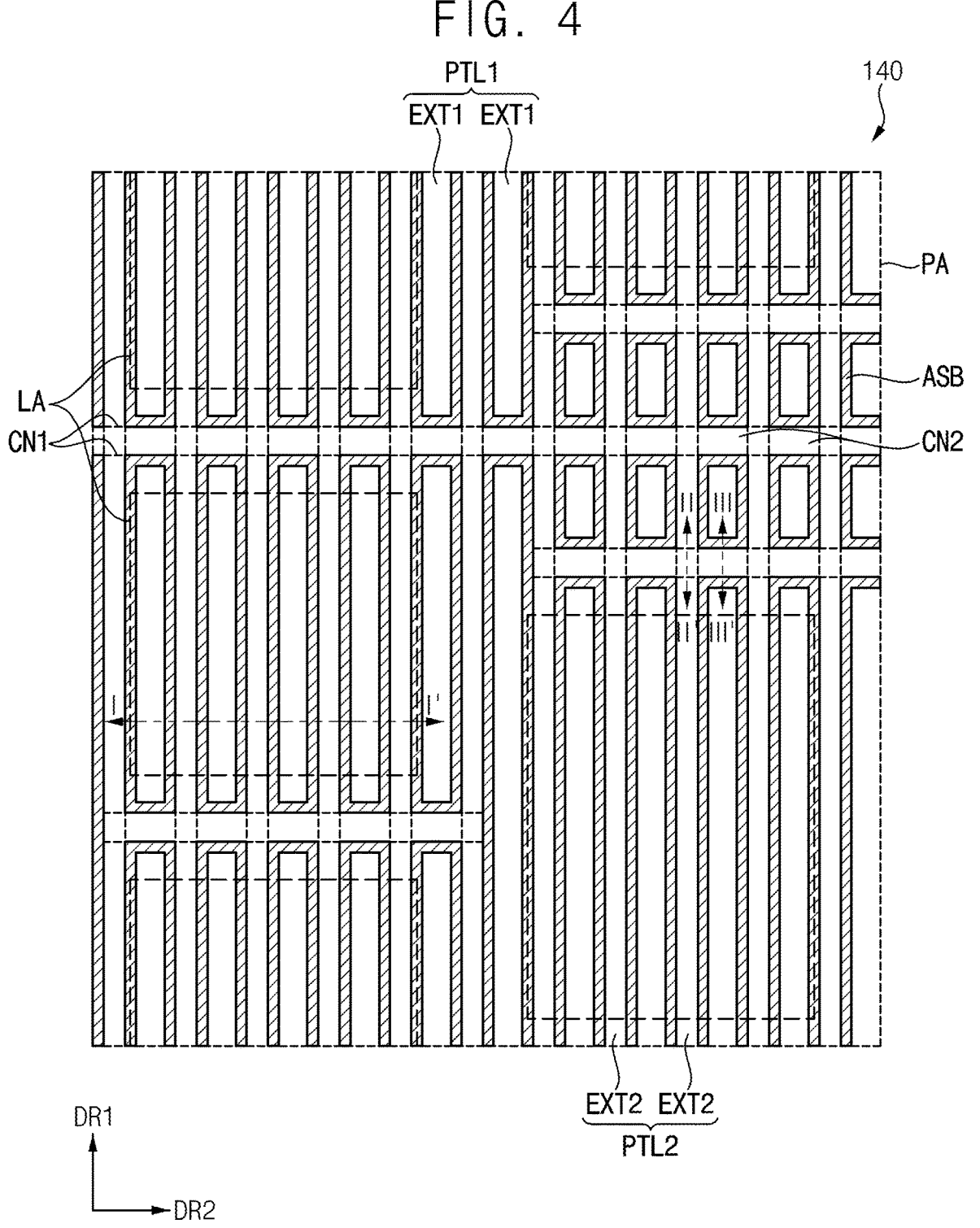
Figure 5:
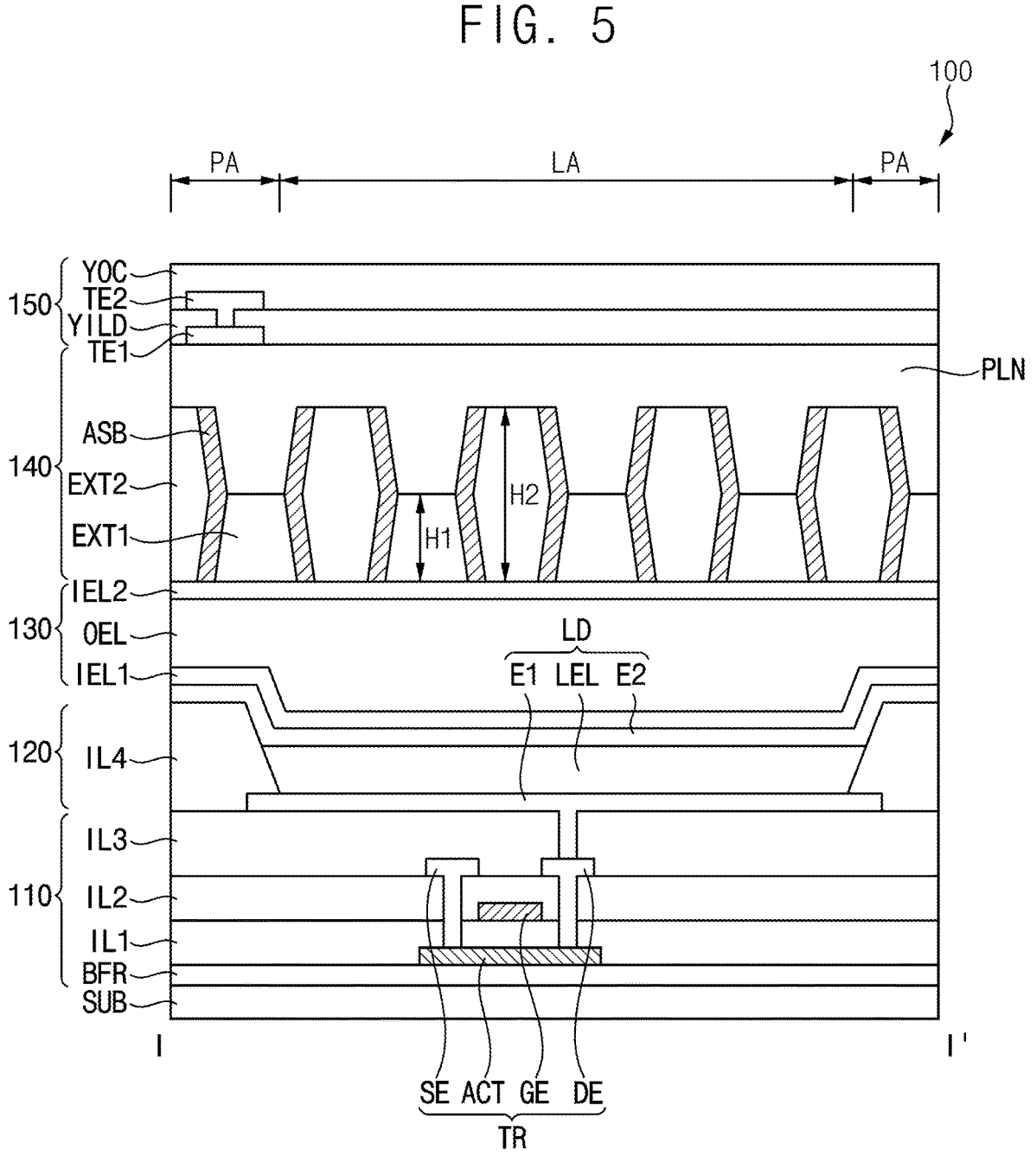
FIG. 5 is a cross-sectional view taken along line I-I' of FIG. 4.
Figure 6:
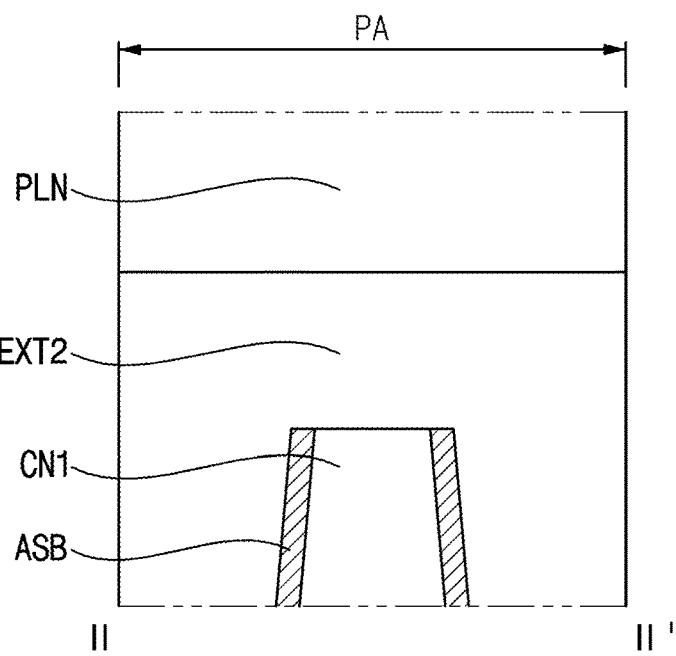
FIG. 6 is a cross-sectional view taken along line II-IF of FIG. 4.
Figure 7:
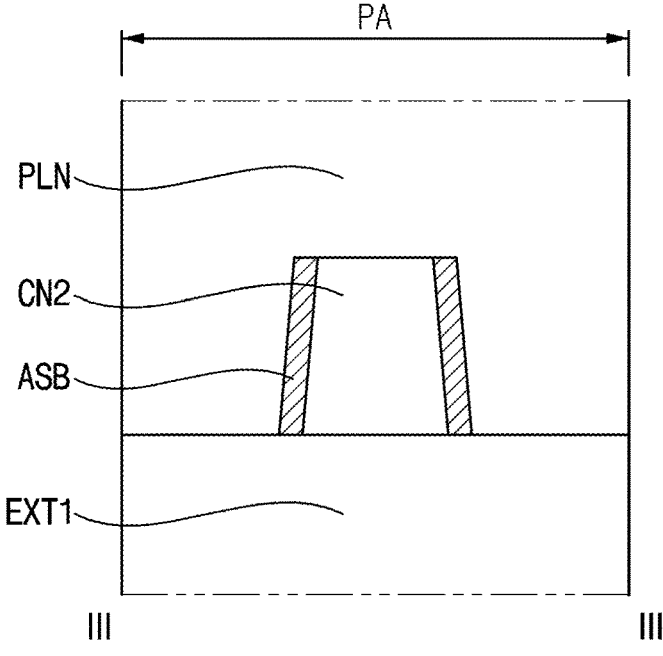
FIG. 7 is a cross-sectional view taken along line III-III' of FIG. 4.

FIGS. 3 and 4 are plan views illustrating a display device according to an embodiment of the present disclosure. FIG. 5 is a cross-sectional view taken along line I-I' of FIG. 4. FIG. 6 is a cross-sectional view taken along line II-IF of FIG. 4. FIG. 7 is a cross-sectional view taken along line III-III' of FIG. 4.

For example, FIG. 3 is a plan view illustrating only a first pattern layer PTL1 and a light absorption film ASB of a light control layer 140 included in the display device 100, and FIG. 4 is a plan view illustrating the first pattern layer PTL1, the second pattern layer PTL2, and the light absorption film ASB of the light control layer 140.

FIGS. 6 and 7 are cross-sectional views illustrating only the light control layer 140 of the display device 100.

Referring to FIGS. 3 to 7, a display device 100 may include a substrate SUB, a circuit element layer 110, a light emitting element layer 120, an encapsulation layer 130, a light control layer 140, and a touch sensing layer 150.

The substrate SUB-may include a transparent or opaque material. For example, the substrate SUB-may be a flexible substrate made of polyimide or the like. The flexible substrate may have a structure in which polyimide layers and barrier layers are alternately stacked. For another example, the substrate SUB may be a rigid substrate made of quartz, glass, or the like.

In an embodiment, the substrate SUB may include a display area and a non-display area. The display area may be an area displaying an image. The non-display area may be disposed around the display area. The non-display area may surround the display area. The non-display area may be an area not displaying an image. In an embodiment, drivers for displaying an image of the display area may be disposed in the non-display area.

Pixels may be arranged in the display area. Signal lines such as a gate line and a data line may be disposed in the display area. The signal lines such as the gate line and the data line may be connected to each of the pixels. Each of the pixels may receive a gate signal, a data signal, and the like from the signal line.

The display area may include light emitting areas LA and a peripheral area PA. The light emitting areas LA may overlap the light emitting element layer 120 and may be areas in which light generated from the light emitting element layer 120 is emitted. The peripheral area PA may surround the light emitting areas LA and may be an area in which light generated from the light emitting element layer 120 is not emitted.

The circuit element layer 110 may be disposed on the substrate SUB, and include a buffer layer BFR, at least one transistor TR, a first insulation layer IL1, a second insulation layer IL2, and a third insulation layer IL3. The transistor TR may include an active layer ACT, a gate electrode GE, a source electrode SE, and a drain electrode DE. The light emitting element layer 120 may be disposed on the circuit element layer 110 and may include a fourth insulation layer IL4 and light emitting diodes LD. The light emitting diode LD may include a first electrode E1, a light emitting layer LEL, and a second electrode E2.

The buffer layer BFR may be disposed on the substrate SUB. The buffer layer BFR may prevent diffusion of metal atoms or impurities from the substrate SUB into the active layer ACT.

The active layer ACT may be disposed on the buffer layer BFR. The active layer ACT may be divided into a source area and a drain area doped with impurities and a channel area between the source area and the drain area.

The first insulation layer IL1 may be disposed on the buffer layer BFR. The first insulation layer IL1 may cover the active layer ACT and be formed to have substantially the same thickness along the profile of the active layer ACT. However, the present disclosure is not limited thereto. For example, the first insulation layer IL1 may include an inorganic material.

The gate electrode GE may be disposed on the first insulation layer IL1. In an embodiment, the gate electrode GE may overlap the channel area of the active layer ACT.

The second insulation layer IL2 may be disposed on the first insulation layer IL1. In addition, the second insulation layer IL2 may cover the gate electrode GE and be disposed with substantially the same thickness along the profile of the gate electrode GE. However, the present disclosure is not limited thereto.

The source electrode SE and the drain electrode DE may be disposed on the second insulation layer IL2. The source electrode SE may contact the source area of the active layer ACT through a first contact hole formed in the first and second insulation layers IL1 and IL2. The drain electrode DE may contact the drain area of the active layer ACT through a second contact hole formed in the first and second insulation layers IL1 and IL2.

The third insulation layer IL3 may be disposed on the second insulation layer IL2. In addition, the third insulation layer IL3 may cover the source and drain electrodes SE and DE, and have a substantially flat top surface without creating a step around the source and drain electrodes SE and DE. For example, the third insulation layer IL3 may include an organic material.

The light emitting diode LD may be disposed on the third insulation layer IL3. The light emitting diode LD may be disposed in the light emitting area LA.

The first electrode E1 may be disposed on the third insulation layer IL3. The first electrode E1 may have reflective or light-transmitting properties. For example, the first electrode E1 may include a metal or a light-transmitting conductive material.

The first electrode E1 may contact the source electrode SE or the drain electrode DE through a third contact hole formed in the third insulation layer IL3. Through this, the first electrode E1 may be connected to the transistor TR.

The fourth insulation layer IL4 may be disposed on the third insulation layer IL3, and an opening exposing a top surface of the first electrode E1 may be defined in the fourth insulation layer IL4. For example, the fourth insulation layer IL4 may include an organic material or an inorganic material.

A spacer may be disposed on the fourth insulation layer IL4. For example, the spacer may include an organic material or an inorganic material. The spacer may maintain a gap between the encapsulation layer 130 and the substrate SUB.

The light emitting layer LEL may be disposed on the first electrode E1. The light emitting layer LEL may be disposed in the opening formed in the fourth insulation layer IL4. The light emitting layer LEL may include organic or inorganic light emitting materials. In an embodiment, the light emitting diode LD may have a multilayer structure including a hole injection layer, a hole transport layer, a light emitting layer LEL, an electron transport layer, and an electron injection layer.

The second electrode E2 may cover the light emitting layer LEL and may be disposed on the fourth insulation layer IL4 and the spacer. In an embodiment, the second electrode E2 may have a plate shape. In addition, the second electrode E2 may have light transmitting or reflecting properties. For example, the second electrode E2 may include a metal or a light-transmitting conductive material.

The encapsulation layer 130 may cover the light emitting element layer 120 and may be disposed on the light emitting element layer 120. The encapsulation layer 130 may prevent penetration of moisture and oxygen into the light emitting diodes LD from the outside. For example, the encapsulation layer 130 may include a first inorganic encapsulation layer IEL1, an organic encapsulation layer OEL, and a second inorganic encapsulation layer IEL2.

The first inorganic encapsulation layer IEL1 may be disposed on the second electrode E2 and have substantially the same thickness along the profile of the second electrode E2. The organic encapsulation layer OEL may be disposed on the first inorganic encapsulation layer IEL1, and have a substantially flat top surface without creating a step around the first inorganic encapsulation layer IEL1. The second inorganic encapsulation layer IEL2 may be disposed on the organic encapsulation layer OEL.

In an embodiment, the light control layer 140 may be disposed on the encapsulation layer 130. The light control layer 140 may include a first pattern layer PTL1, a second pattern layer PTL2, a light absorption film ASB, and a planarization film PLN.

The first pattern layer PTL1 and the second pattern layer PTL2 may be disposed on the encapsulation layer 130. The first pattern layer PTL1 and the second pattern layer PTL2 may be disposed adjacent to each other. Each of the first pattern layer PTL1 and the second pattern layer PTL2 may include at least one of an acrylic-based resin, a methacrylic-based resin, a polyisoprene-based resin, a vinyl-based resin, an epoxy-based resin, an urethane-based resin, a cellulose-based resin, a siloxane-based resin, a polyimide-based resin, a polyamide-based resin, and a perylene-based resin.

The first pattern layer PTL1 may include first extension parts EXT1 and first connection parts CN1. The first extension parts EXT1 and the first connection parts CN1 may be disposed on the same layer. The first extension parts EXT1 and the first connection parts CN1 may be integrally formed.

The first extension parts EXT1 may extend in a first direction DR1. The first extension parts EXT1 may be disposed in the light emitting areas LA and the peripheral area PA.

The first connection parts CN1 may connect adjacent first extension parts EXT1 among the first extension parts EXT1 to each other. Each of the first connection parts CN1 may extend in a second direction DR2. The second direction DR2 may cross the first direction DR1. The first connection parts CN1 may be disposed in the peripheral area PA. Accordingly, the first connection parts CN1 may be spaced apart from the light emitting area LA in a plan view.

The first connection parts CN1 may overlap each other in the second direction DR2. However, the present disclosure is not limited thereto, and the first connection parts CN1 may be alternately disposed along the second direction DR2.

The second pattern layer PTL2 may include second extension parts EXT2 and second connection parts CN2. The second extension parts EXT2 and the second connection parts CN2 may be disposed on the same layer. The second extension parts EXT2 and the second connection parts CN2 may be integrally formed.

The second extension parts EXT2 may extend in the first direction DR1. The second extension parts EXT2 may be disposed in the light emitting areas LA and the peripheral area PA.

Each of the second extension parts EXT2 may be disposed between the first extension parts EXT1. The first extension parts EXT1 and the second extension parts EXT2 may be alternately disposed in the plan view. A height H2 of each of the second extension parts EXT2 may be greater than a height H1 of each of the first extension parts EXT1.

The second connection parts CN2 may connect adjacent second extension parts EXT2 among the second extension parts EXT2 to each other. Each of the second connection parts CN2 may extend in the second direction DR2. The second connection parts CN2 may be disposed in the peripheral area PA. Accordingly, the second connection parts CN2 may be spaced apart from the light emitting area LA in the plan view.

In an embodiment, the second extension parts EXT2 may respectively cover the first connection parts CN1. The second extension parts EXT2 may overlap the first connection parts CN1.

Also, the second connection parts CN2 may be respectively disposed on the first extension parts EXT1. The second connection parts CN2 may respectively overlap the first extension parts EXT1.

The second connection parts CN2 may overlap each other in the second direction DR2. However, the present disclosure is not limited thereto, and the second connection parts CN2 may be alternately disposed along the second direction DR2.

In an embodiment, the first connection parts CN1 and the second connection parts CN2 may overlap each other in the second direction DR2. Therefore, in the plan view, the first connection parts CN1 and portions of the first extension parts EXT1 adjacent to the first connection parts CN1 in the second direction DR2 may overlap the second connection parts CN2 and portions of the second extension parts EXT2 adjacent to the second connection parts CN2 in the second direction DR2 in the second direction DR2. Accordingly, the first connection parts CN1, the portions of the first extension parts EXT1 adjacent to the first connection parts CN1 in the second direction DR2, the second connection parts CN2, and the portions of the second extension parts EXT2 adjacent to the second connection parts CN2 in the second direction DR2 may form a shape extending in the second direction DR2. However, the present disclosure is not limited thereto.

The light absorption film ASB may be disposed on the encapsulation layer 130. The light absorption film ASB may cover side surfaces of the first extension parts EXT1 and the second extension parts EXT2. In addition, the light absorption film ASB may expose top surfaces of each of the first extension parts EXT1 and the second extension parts EXT2.

Light emitted from the light emitting diode LD may be incident on the light absorption film ASB or may pass between the light absorption films ASB. Light incident on the light absorption film ASB may be reflected by the light absorption film ASB, may pass through the light absorption film ASB, or may be absorbed by the light absorption film ASB.

In an embodiment, the light absorption film ASB may cover side surfaces of the first connection parts CN1 and the second connection parts CN2. In addition, the light absorption film ASB may expose top surfaces of the first connection parts CN1 and the second connection parts CN2. However, the present disclosure is not limited thereto, and the light absorption film ASB may not cover the side surfaces of the first connection parts CN1 and the second connection parts CN2.

In an embodiment, the light absorption film ASB may include molybdenum-tantalum oxide (MTO). The light absorption film ASB may have a multi-layer structure. For example, the light absorption film ASB may have an MTO single layer structure. For another example, the light absorption film ASB may have a double layer structure of at least one selected from the group consisting of MTO/molybdenum(Mo), MTO/copper(Cu), and MTO/aluminum(Al). As another example, the light absorption film ASB may have a triple layer structure of at least one selected from the group consisting of MTO/Mo/MTO, MTO/Cu/MTO, and MTO/Al/MTO. However, the light absorption film ASB is not limited to including molybdenum-tantalum oxide (MTO). For example, the light absorption film ASB may include various materials having relatively low transmittance and reflectance and relatively high absorbance.

In an embodiment, the viewing angle of the display device 100 may be adjusted by allowing light emitted from the light emitting diode LD to pass between the light absorption films ASB. For example, in the narrow viewing angle mode, a portion of the light having a relatively wide viewing angle may be absorbed by the light absorption film ASB. Also, in the narrow viewing angle mode, another portion of the light having a relatively narrow viewing angle may pass through the first pattern layer PTL1 or the second pattern layer PTL2 between the light absorption films ASB. Accordingly, the viewing angle of the display device 100 may be adjusted through the light absorption film ASB.

Referring further to FIG. 2, the display device 100C in front of the passenger seat 60 may not be visually recognized by the driver through the light absorption film ASB. In this case, the light absorption film ASB may be disposed in a vertical direction.

In addition, the display devices 100A, 100B, and 100C disposed on the dashboard 40 are prevented from being reflected on the windshield 30 so that the driver's view may be secured. In this case, the light absorption film ASB may be disposed in a left-right direction. However, the present disclosure is not limited thereto, and the light absorption film ASB may be disposed in the up, down, left and right directions to have a grid pattern.

The planarization film PLN may cover the first pattern layer PTL1, the second pattern layer PTL2, and the light absorption film ASB. The planarization film PLN may be disposed on the first pattern layer PTL1, the second pattern layer PTL2, and the light absorption film ASB, and have a substantially flat top surface without creating a step around the first pattern layer PTL1, the second pattern layer PTL2, and the light absorption film ASB. For example, the planarization film PLN may include an organic material.

The touch sensing layer 150 may be disposed on the light control layer 140. The touch sensing layer 150 may include a first touch electrode TE1, a touch insulation layer YILD, a second touch electrode TE2, and a touch planarization film YOC.

The first touch electrode TE1 may be disposed on the planarization film PLN, the touch insulation layer YILD may be disposed on the first touch electrode TE1, the second touch electrode TE2 may be disposed on the touch insulation layer YILD, and the touch planarization film YOC may be disposed on the second touch electrode TE2. The touch planarization film YOC may have a substantially flat top surface. The touch planarization film YOC may be substantially parallel to a top surface of the light emitting diode LD. The second touch electrode TE2 may be connected to the first touch electrode TE1 through a contact hole. The touch sensing layer 150 may function as an input means of the display device 100.

In an embodiment, as the first pattern layer PTL1 includes the first connection parts CN1 and the second pattern layer PTL2 includes the second connection parts CN2, the first extension parts EXT1 may be connected to each other by the first connection parts CN1, and the second extension parts EXT2 may be connected to each other by the second connection parts CN2. That is, as the first connection extension parts CN1 connect the first extension parts EXT1 and the second connection parts CN2 connect the second extension parts EXT2, separation or loss of the first extension parts EXT1 and the second extension parts EXT2 may be prevented. Accordingly, reliability of the display device 100 may be improved.

Figure 8:
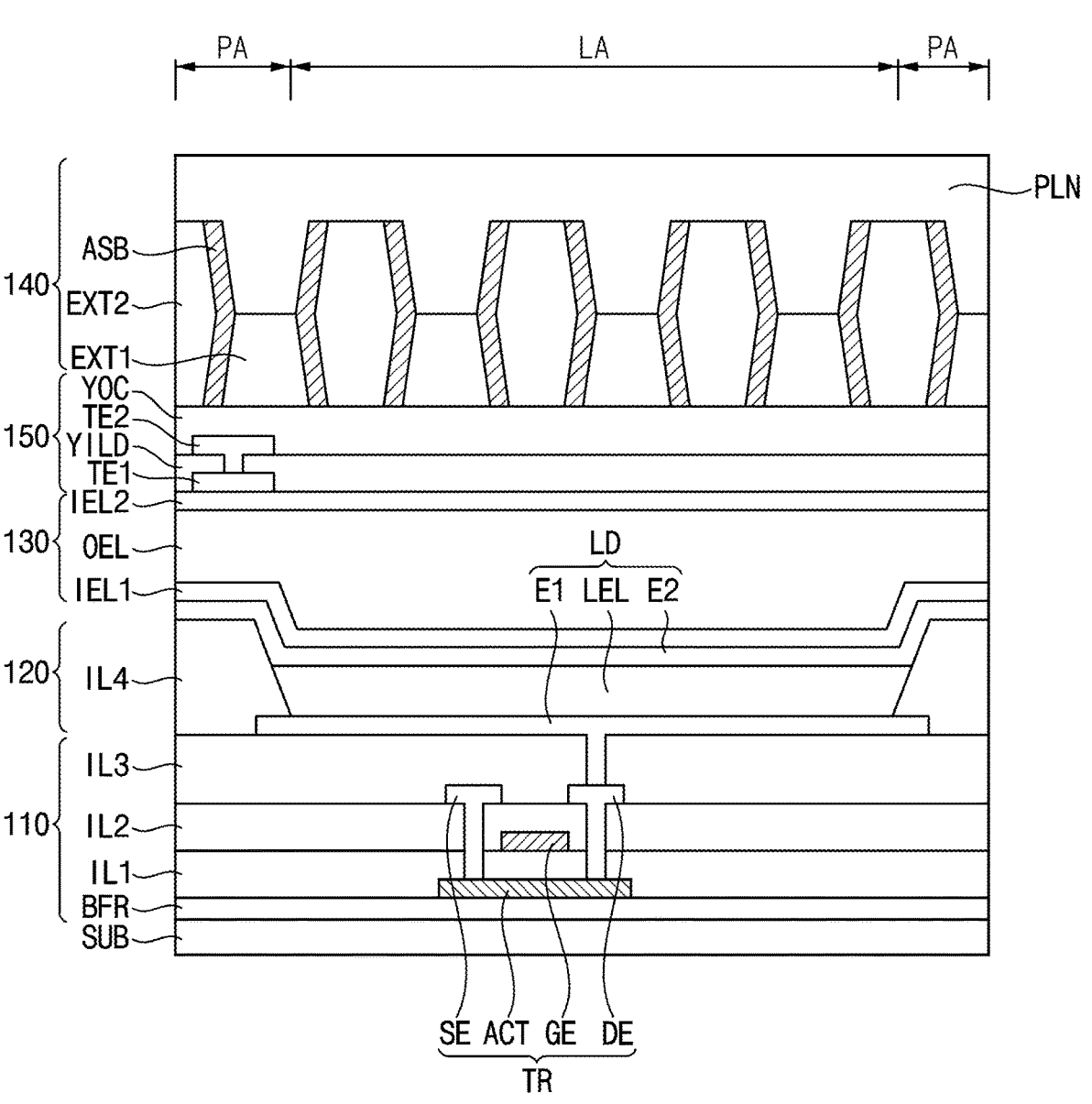
FIG. 8 is a cross-sectional view illustrating another embodiment of FIG. 5.

FIG. 8 is a cross-sectional view illustrating another embodiment of a display device.

Referring to FIG. 8, a light control layer 140 may be disposed on a touch sensing layer 150. The touch sensing layer 150 may include a first touch electrode TE1, a touch insulation layer YILD, a second touch electrode TE2, and a touch planarization film YOC. That is, the first touch electrode TE1 included in the touch sensing layer 150 may be disposed on the encapsulation layer 130. The first pattern layer PTL1, the second pattern layer PTL2, and the light absorption film ASB may be disposed on the touch planarization film YOC included in the touch sensing layer 150.

Figure 9:
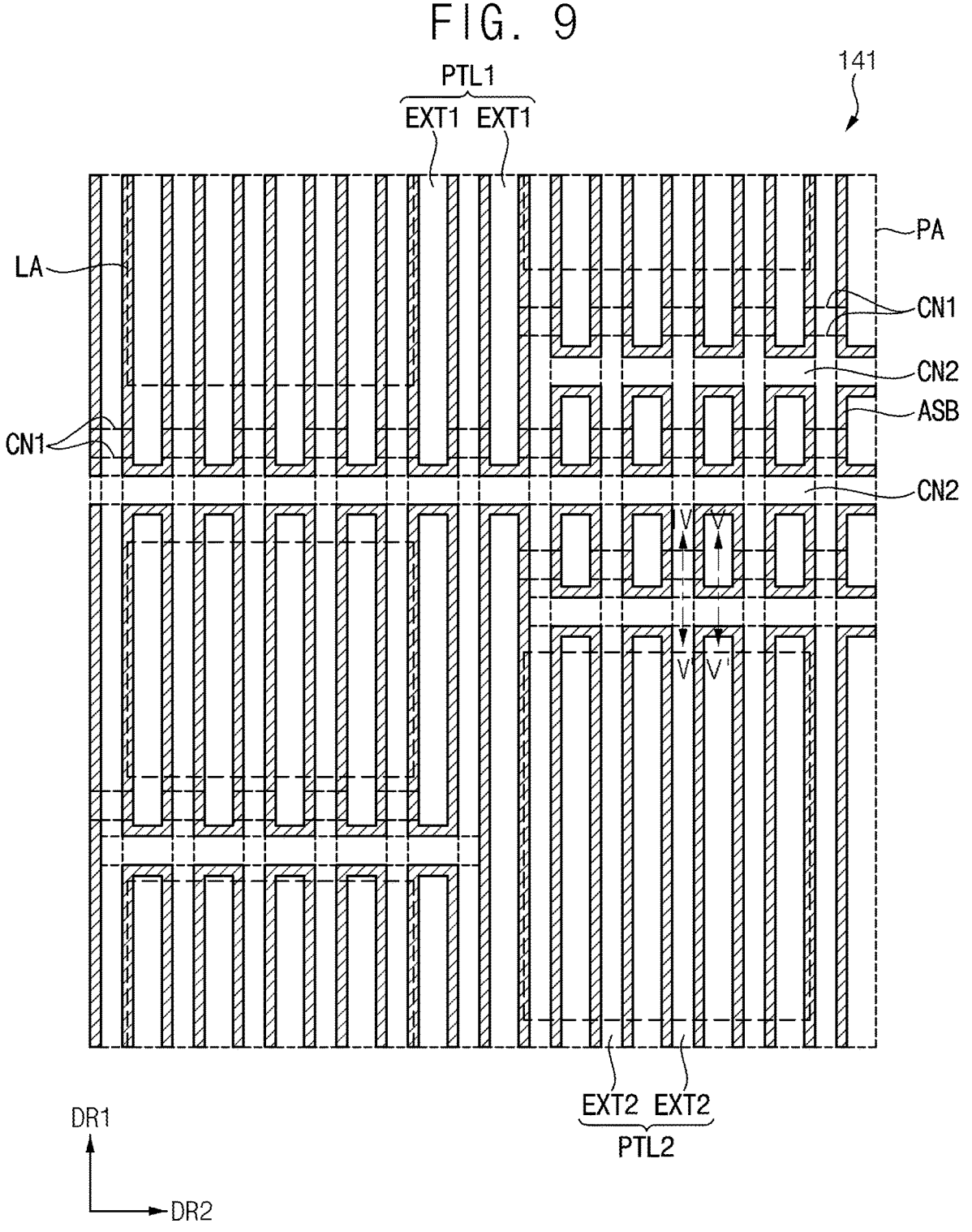
FIG. 9 is a plan view illustrating another embodiment of FIG. 4.
Figure 10:
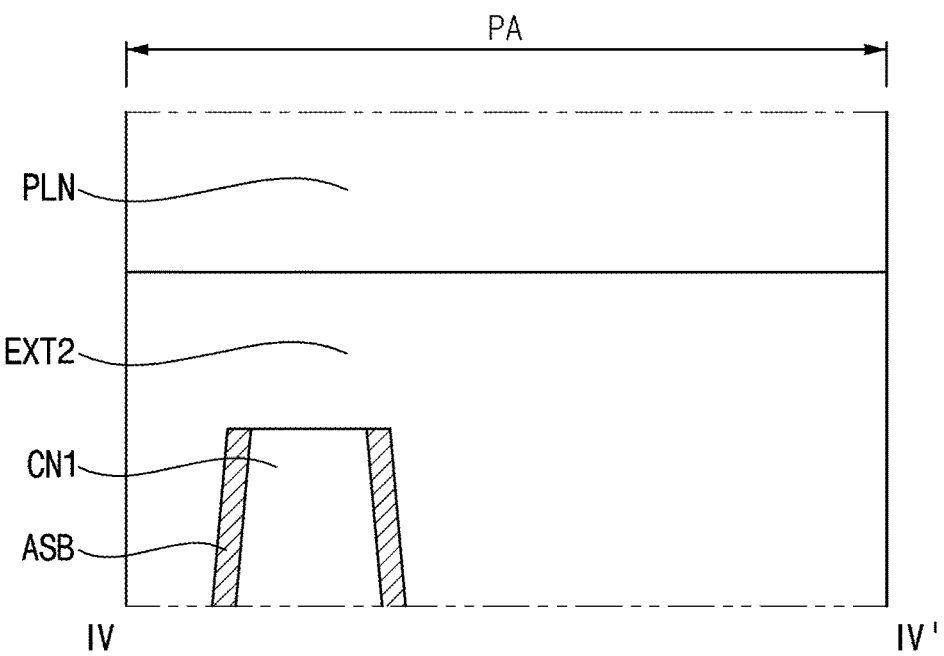
FIG. 10 is a cross-sectional view taken along line IV-IV' of FIG. 9.
Figure 11:
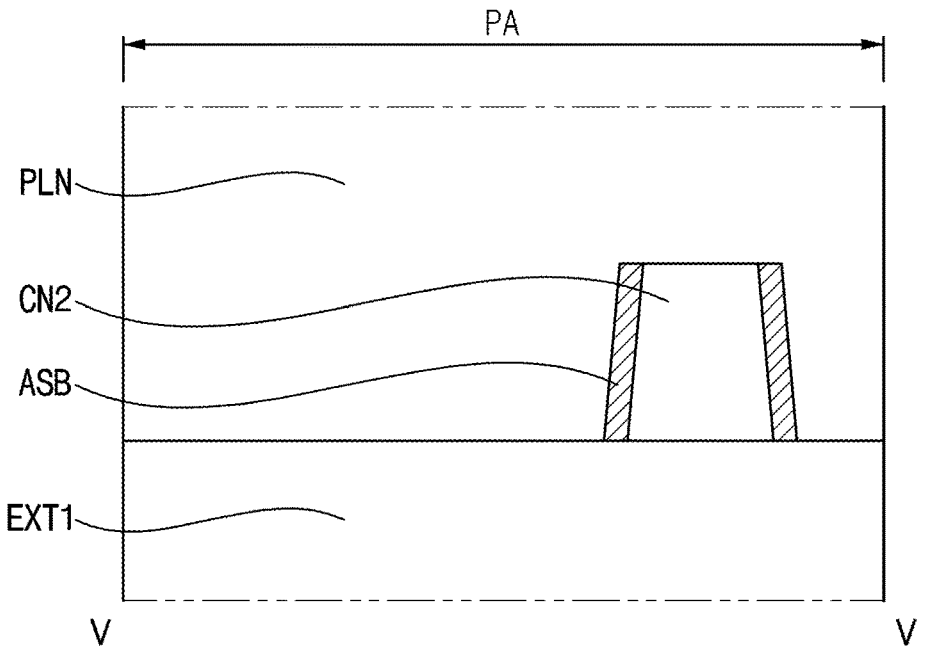
FIG. 11 is a cross-sectional view taken along line V-V' of FIG. 9.

FIG. 9 is a plan view illustrating another embodiment of a display device. FIG. 10 is a cross-sectional view taken along line IV-IV' of FIG. 9. FIG. 11 is a cross-sectional view taken along line V-V' of FIG. 9.

The light control layer 141 described with reference to FIGS. 9 to 11 may be the same as or similar to the light control layer 140 described with reference to FIGS. 3 to 7 except for placement relationship of the first connection parts CN1 and the second connection parts CN2. Therefore, redundant descriptions may be omitted.

Referring to FIGS. 9 to 11, a light control layer 141 may include a first pattern layer PTL1, a second pattern layer PTL2, a light absorption film ASB, and a planarization film PLN. The first pattern layer PTL1 may include first extension parts EXT1 and first connection parts CN1, and the second pattern layer PTL2 may include second extension parts EXT2 and second connection parts CN2.

In an embodiment, the first connection parts CN1 and the second connection parts CN2 may be alternately disposed along the second direction DR2. Therefore, in a plan view, the first connection parts CN1 and portions of the first extension parts EXT1 adjacent to the first connection parts CN1 in the second direction DR2 may not overlap the second connection parts CN2 and portions of the second extension parts EXT2 adjacent to the second connection parts CN2 in the second direction DR2 in the second direction DR2. Accordingly, the first connection parts CN1 and the second connection parts CN2 may have a zigzag shape in the second direction DR2. However, the present disclosure is not limited thereto.

Figure 12:
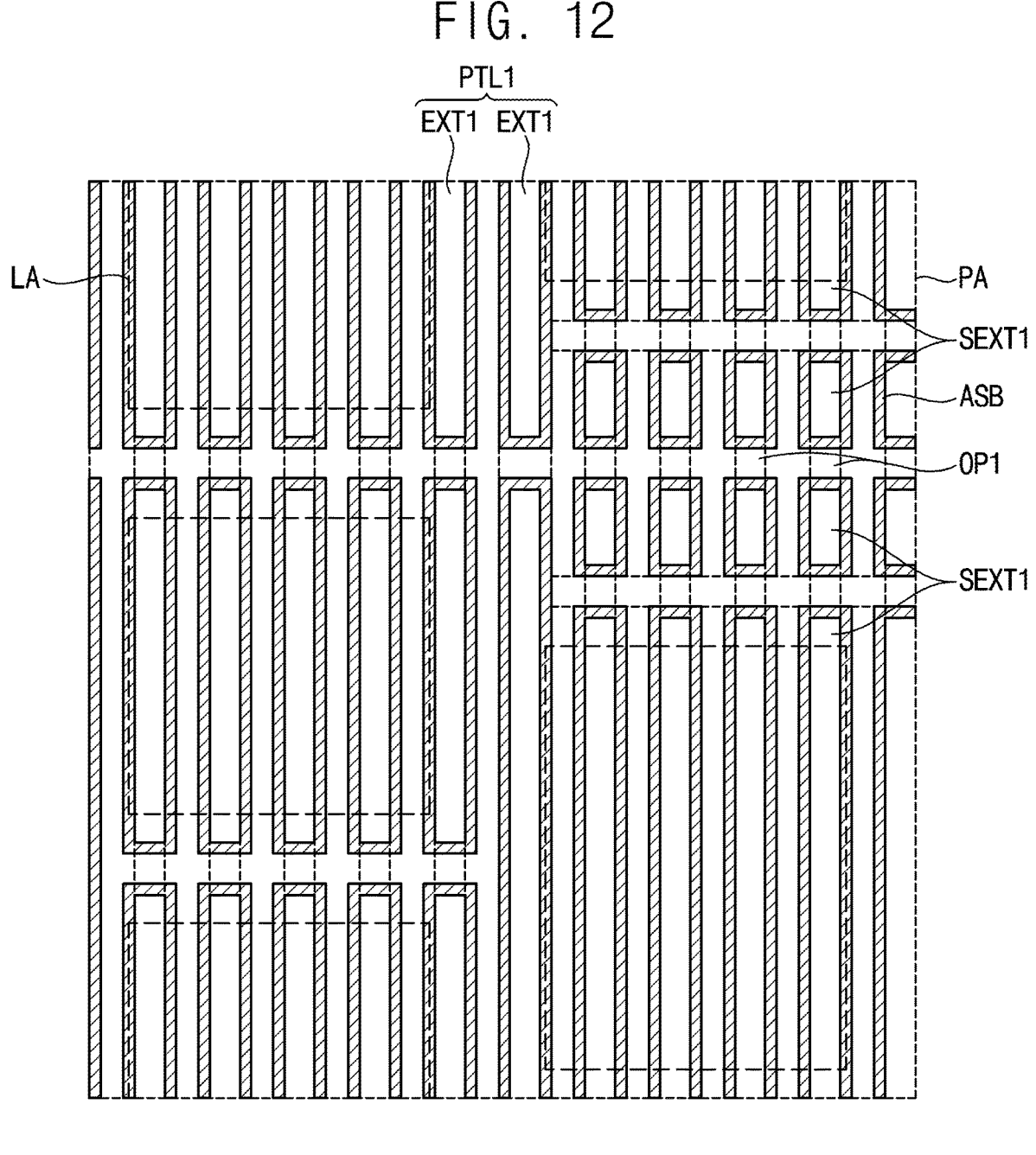
FIGS. 12 and 13 are plan views illustrating a display device according to an embodiment of the present disclosure.
Figure 13:
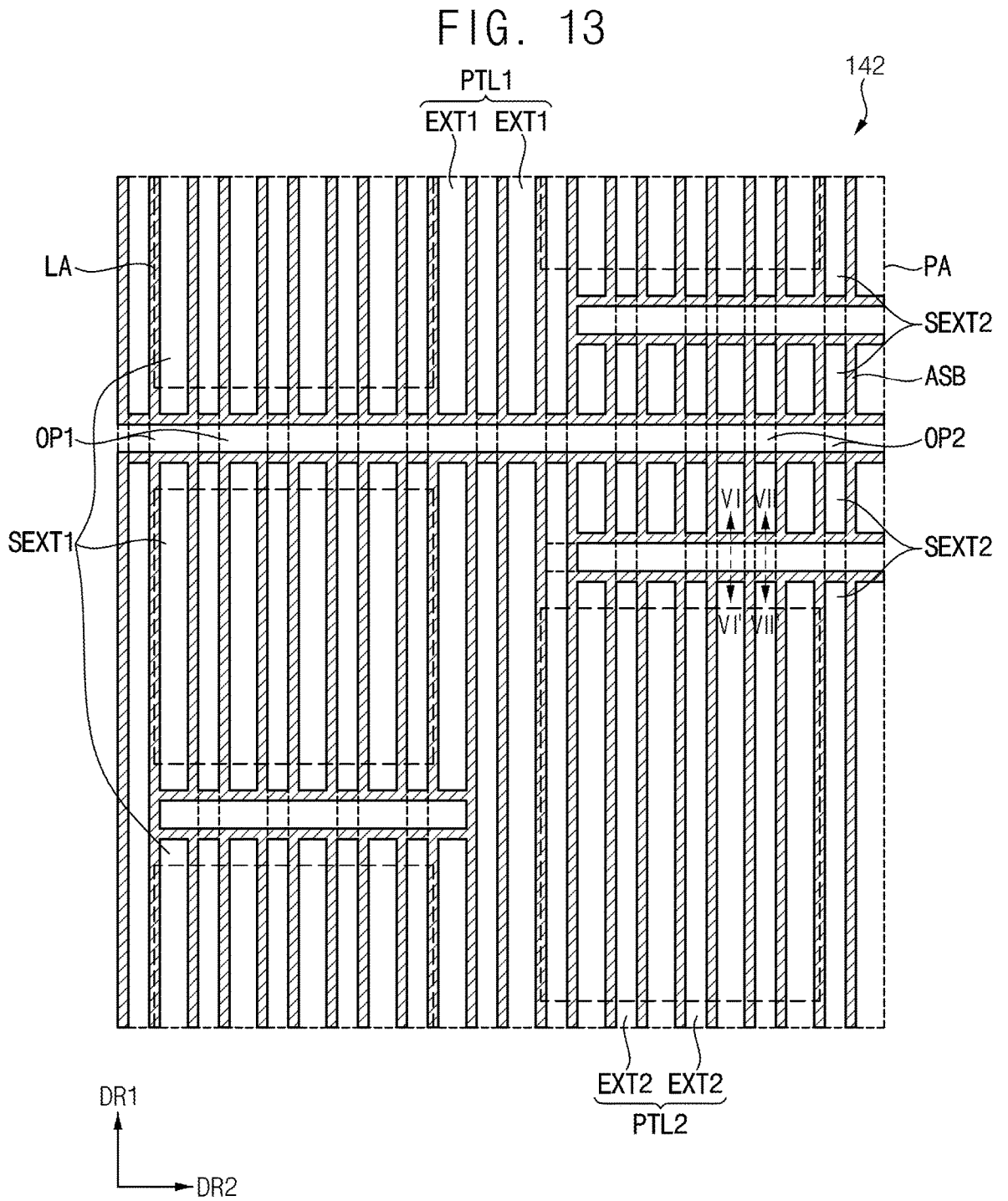
Figure 14:
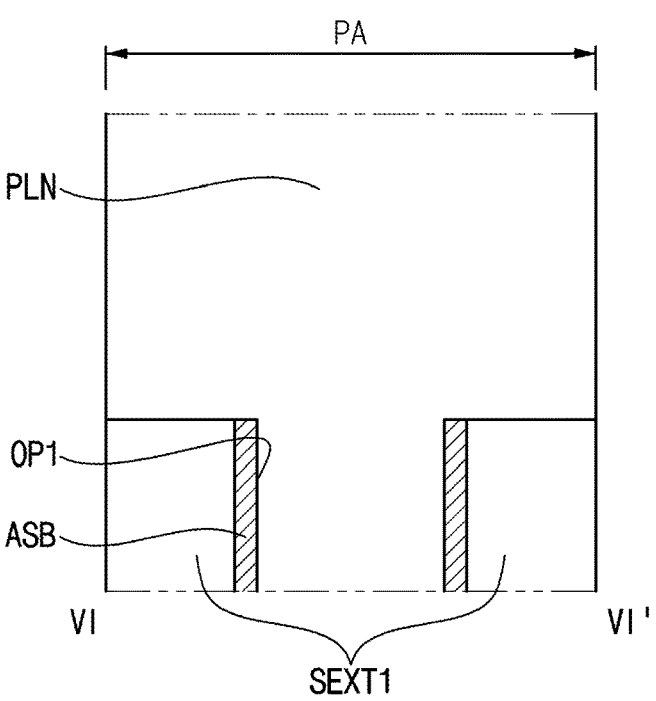
FIG. 14 is a cross-sectional view taken along line VI-VI' of FIG. 13.
Figure 15:
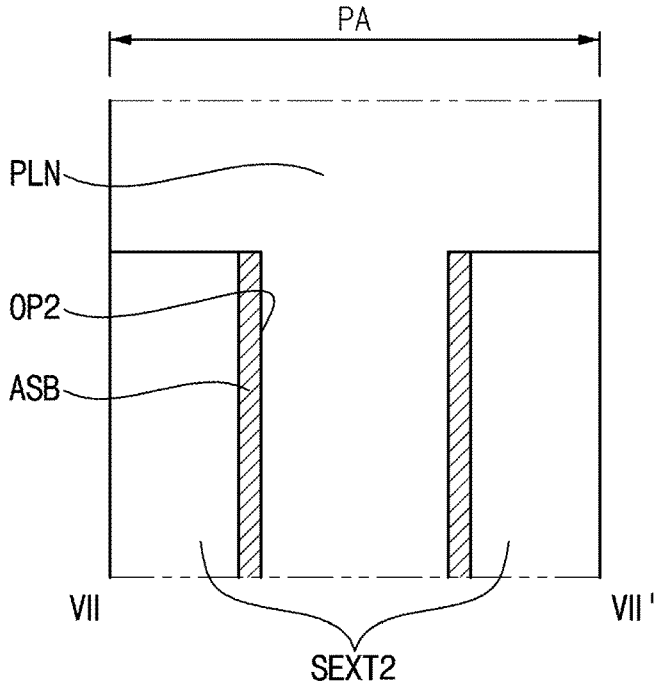
FIG. 15 is a cross-sectional view taken along line VII-VII' of FIG. 13.

FIGS. 12 and 13 are plan views illustrating a display device according to an embodiment of the present disclosure. FIG. 14 is a cross-sectional view taken along line VI-VI' of FIG. 13. FIG. 15 is a cross-sectional view taken along line VII-VII' of FIG. 13.

Hereinafter, parts of a light control layer 142 described with reference to FIGS. 12 to 15, overlapping with the light control layer 140 described with reference to FIGS. 3 to 7 may be omitted.

For example, FIG. 12 is a plan view illustrating only a first pattern layer PTL1 and a light absorption film ASB of a light control layer 142, and FIG. 13 is a plan view illustrating a first pattern layer PTL1, a second pattern layer PTL2, and a light absorption film ASB of a light control layer 142.

Referring to FIGS. 12 to 15, a light control layer 142 may include a first pattern layer PTL1, a second pattern layer PTL2, a light absorption film ASB, and a planarization film PLN.

The first pattern layer PTL1 and the second pattern layer PTL2 may be disposed on the encapsulation layer 130. The first pattern layer PTL1 and the second pattern layer PTL2 may be disposed adjacent to each other.

The first pattern layer PTL1 may include first extension parts EXT1. The first extension parts EXT1 may extend in the first direction DR1. The first extension parts EXT1 may be disposed in the light emitting areas LA and the peripheral area PA.

At least one first opening OP1 may be defined in each of the first extension parts EXT1. The first opening OP1 may separate the first extension parts EXT1 into a plurality of first sub-extension parts SEXT1. That is, each of the first extension parts EXT1 may include first sub-extension parts SEXT1. The first sub-extension parts SEXT1 may be spaced apart from each other by the first opening OP1.

The first opening OP1 may be defined in the peripheral area PA. Accordingly, the first opening OP1 may be spaced apart from the light emitting diode LD in the plan view.

The second pattern layer PTL2 may include second extension parts EXT2. The second extension parts EXT2 may extend in the first direction DR1. The second extension parts EXT2 may be disposed in the light emitting areas LA and the peripheral area PA.

Each of the second extension parts EXT2 may be disposed between the first extension parts EXT1. The first extension parts EXT1 and the second extension parts EXT2 may be alternately disposed in the plan view. The height of each of the second extension parts EXT2 may be greater than the height of each of the first extension parts EXT1.

At least one second opening OP2 may be defined in each of the second extension parts EXT2. The second opening OP2 may separate the second extension parts EXT2 into a plurality of second sub-extension parts SEXT2. That is, each of the second extension parts EXT2 may include the second sub-extension parts SEXT2. The second sub-extension parts SEXT2 may be spaced apart from each other by the second opening OP2.

The second opening OP2 may be defined in the peripheral area PA. Accordingly, the second opening OP2 may be spaced apart from the light emitting diode LD in the plan view.

The first openings OP1 defined in the first extension parts EXT1 may overlap each other in the second direction DR2. In addition, the second openings OP2 defined in the second extension parts EXT2 may overlap each other in the second direction DR2. However, the present disclosure is not limited thereto.

In an embodiment, the first openings OP1 and the second openings OP2 may overlap each other in the second direction DR2. Accordingly, the first openings OP1 and the second openings OP2 may form one large opening extending in the second direction DR2. However, the present disclosure is not limited thereto.

The light absorption film ASB may be disposed on the encapsulation layer 130. The light absorption film ASB may cover side surfaces of the first sub-extension parts SEXT1 and the second sub-extension parts SEXT2.

The planarization film PLN may be disposed on the first pattern layer PTL1, the second pattern layer PTL2, and the light absorption film ASB, and cover the first pattern layer PTL1, the second pattern layer PTL2, and the light absorption film ASB. Also, the planarization film PLN may fill the first openings OP1 and the second openings OP2. The planarization film PLN may have a substantially flat top surface without creating a step around the first pattern layer PTL1, the second pattern layer PTL2, and the light absorption film ASB.

In an embodiment, as the first openings OP1 are defined in the first pattern layer PTL1 and the second openings OP2 are defined in the second pattern layer PTL2, the first extension parts EXT1 may be separated into the plurality of first sub-extension parts SEXT1 by the first openings OP1, and the second extension parts EXT2 may be separated into the plurality of second sub-extension parts SEXT2 by the second openings OP2. As the first openings OP1 partially cut off the first extension parts EXT1 and the second openings OP2 partially cut off the second extension parts EXT2, all of the first extension parts EXT1 and the second extension parts EXT2 may not be torn off at once when some of the first extension parts EXT1 and the second extension parts EXT2 are torn off. That is, separation or loss of the first extension parts EXT1 and the second extension parts EXT2 may be prevented. Accordingly, reliability of the display device 100 may be improved.

Figure 16:
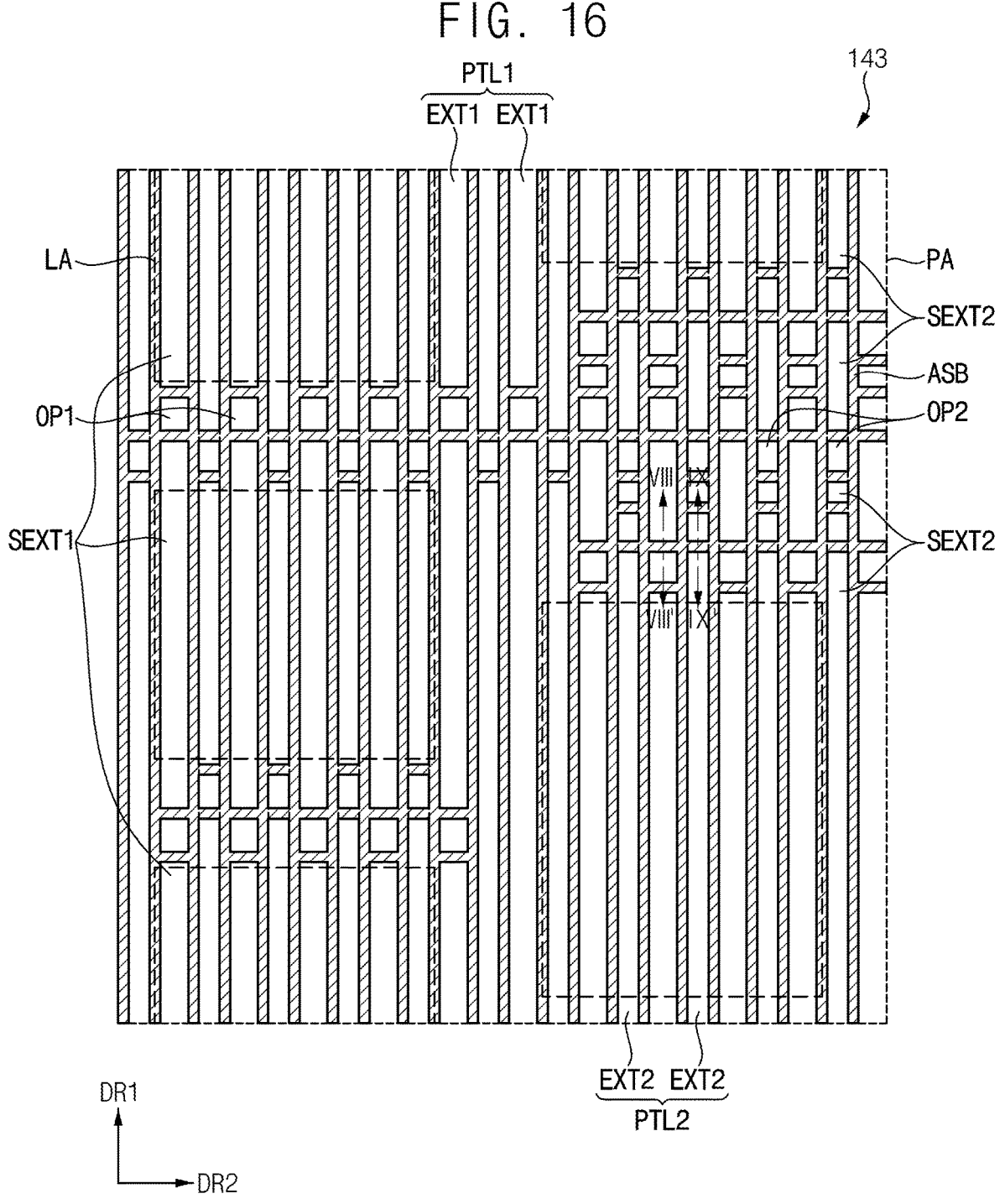
FIG. 16 is a plan view illustrating another embodiment of FIG. 13.
Figure 17:
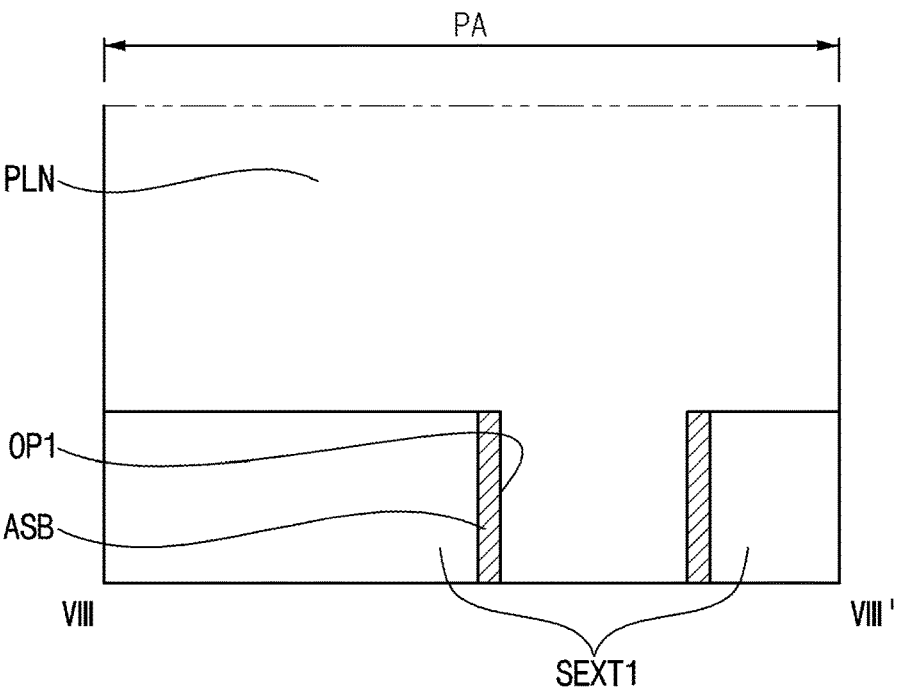
FIG. 17 is a cross-sectional view taken along line VIII-VIII' of FIG. 16.
Figure 18:
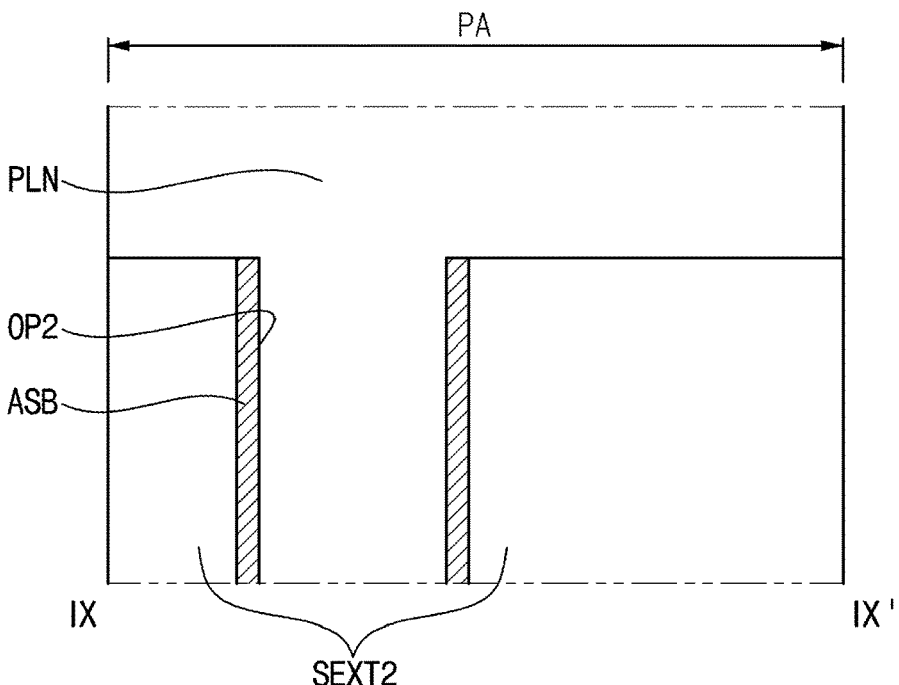
FIG. 18 is a cross-sectional view taken along line IX-IX' of FIG. 16.

FIG. 16 is a plan view illustrating another embodiment of a display device. FIG. 17 is a cross-sectional view taken along line VIII-VIII' of FIG. 16. FIG. 18 is a cross-sectional view taken along line IX-IX' of FIG. 16.

A light control layer 143 described with reference to FIGS. 16 to 18 may be the same as or similar to the light control layer 142 described with reference to FIGS. 12 to 15 except for the placement relationship of the first openings OP1 and second openings OP2. Therefore, redundant descriptions may be omitted.

Referring to FIGS. 16 to 18, the light control layer 143 may include a first pattern layer PTL1, a second pattern layer PTL2, a light absorption film ASB, and a planarization film PLN. The first pattern layer PTL1 may include first extension parts EXT1, and each of the first extension parts EXT1 may define at least one first opening OP1. The second pattern layer PTL2 may include second extension parts EXT2, and each of the second extension parts EXT2 may define at least one second opening OP2.

In an embodiment, the first opening OP1 and the second opening OP2 may be alternately disposed along the second direction DR2. Accordingly, the first openings OP1 and the second openings OP2 may have a zigzag shape in the second direction DR2. However, the present disclosure is not limited thereto.

FIGS. 19 to 36 are views illustrating a method of manufacturing a light control layer according to an embodiment of the present disclosure.

For example, a method of manufacturing a light control layer described with reference to FIGS. 19 to 36 may be a method of manufacturing the light control layer 140 described with reference to FIGS. 3 to 7.

Figure 20:
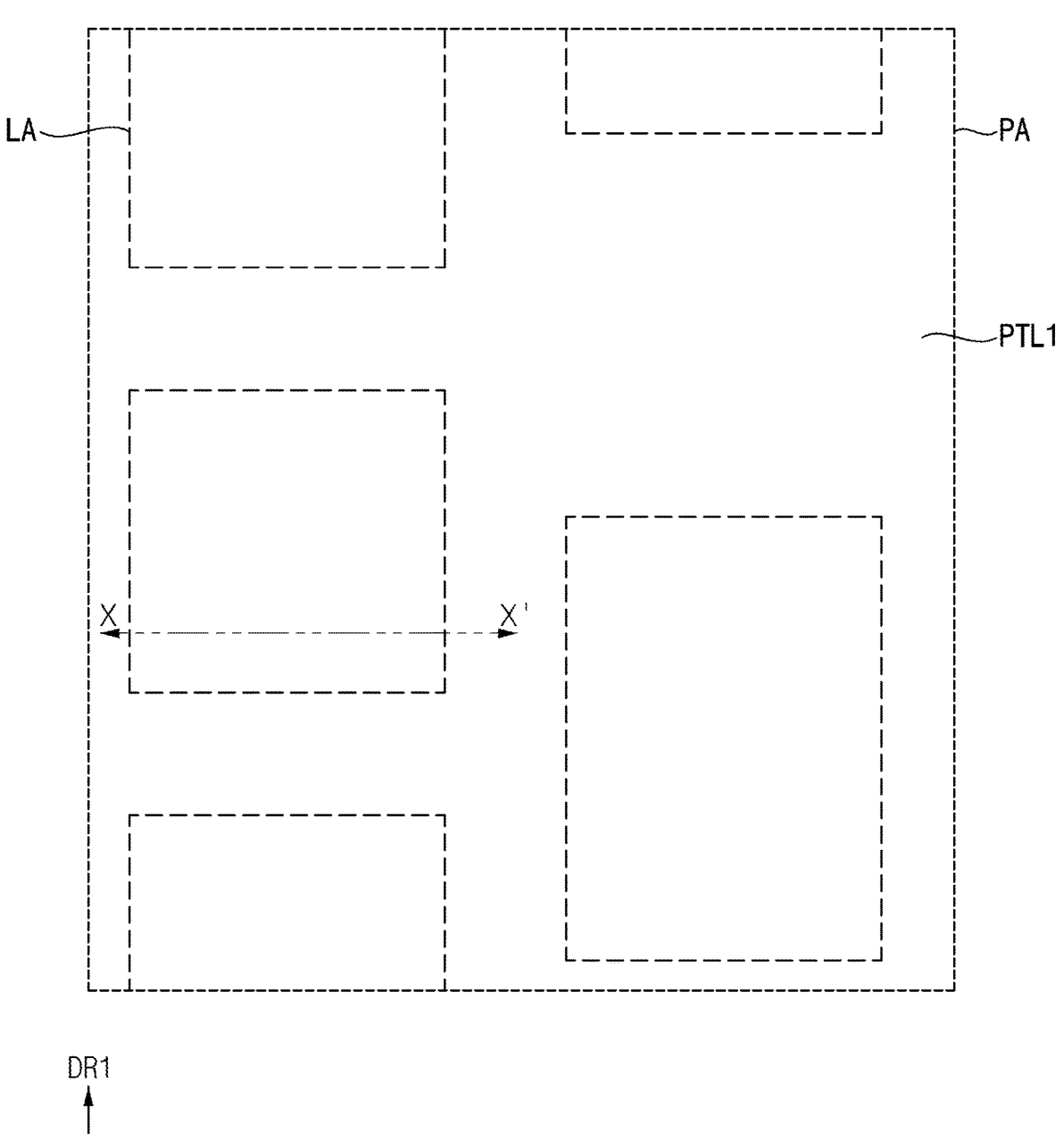
Figure 21:
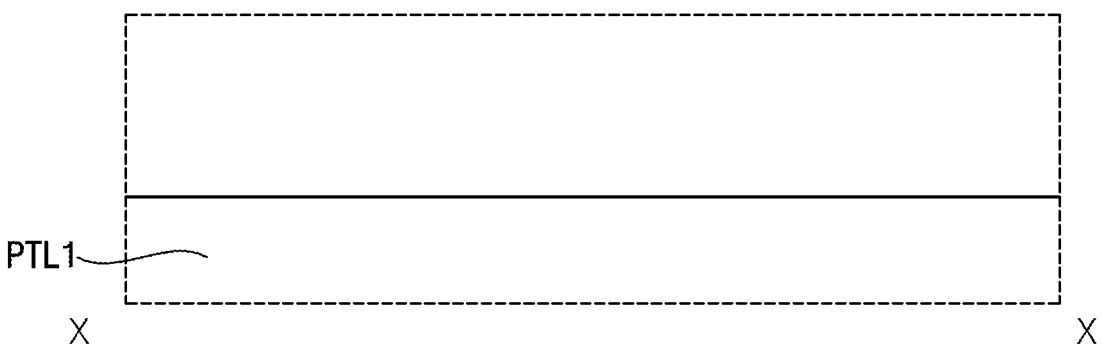

FIG. 21 is a cross-sectional view taken along line X-X' of FIG. 20.

Figure 19:
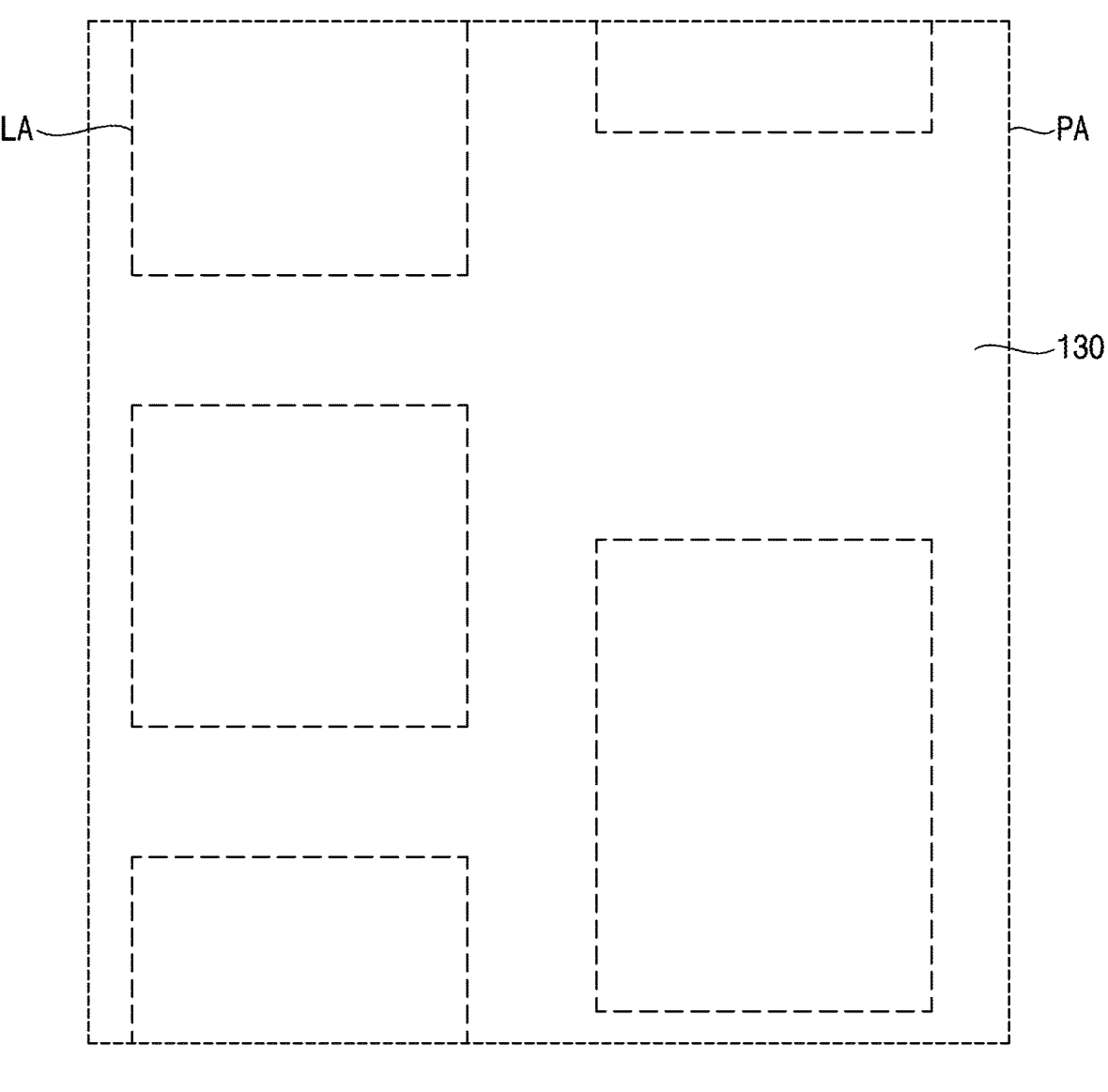

Referring to FIGS. 19 to 21, a first pattern layer PTL1 may be formed on the encapsulation layer 130. For example, the first pattern layer PTL1 may be formed of an acrylic resin, a methacrylic-based resin, a polyisoprene-based resin, a vinyl-based resin, an epoxy-based resin, an urethane-based resin, a cellulose-based resin, a siloxane-based resin, a polyimide-based resin, a polyamide-based resin and a perylene-based resin. The first pattern layer PTL1 may be entirely formed in the light emitting areas LA and the peripheral area PA.

Figure 22:
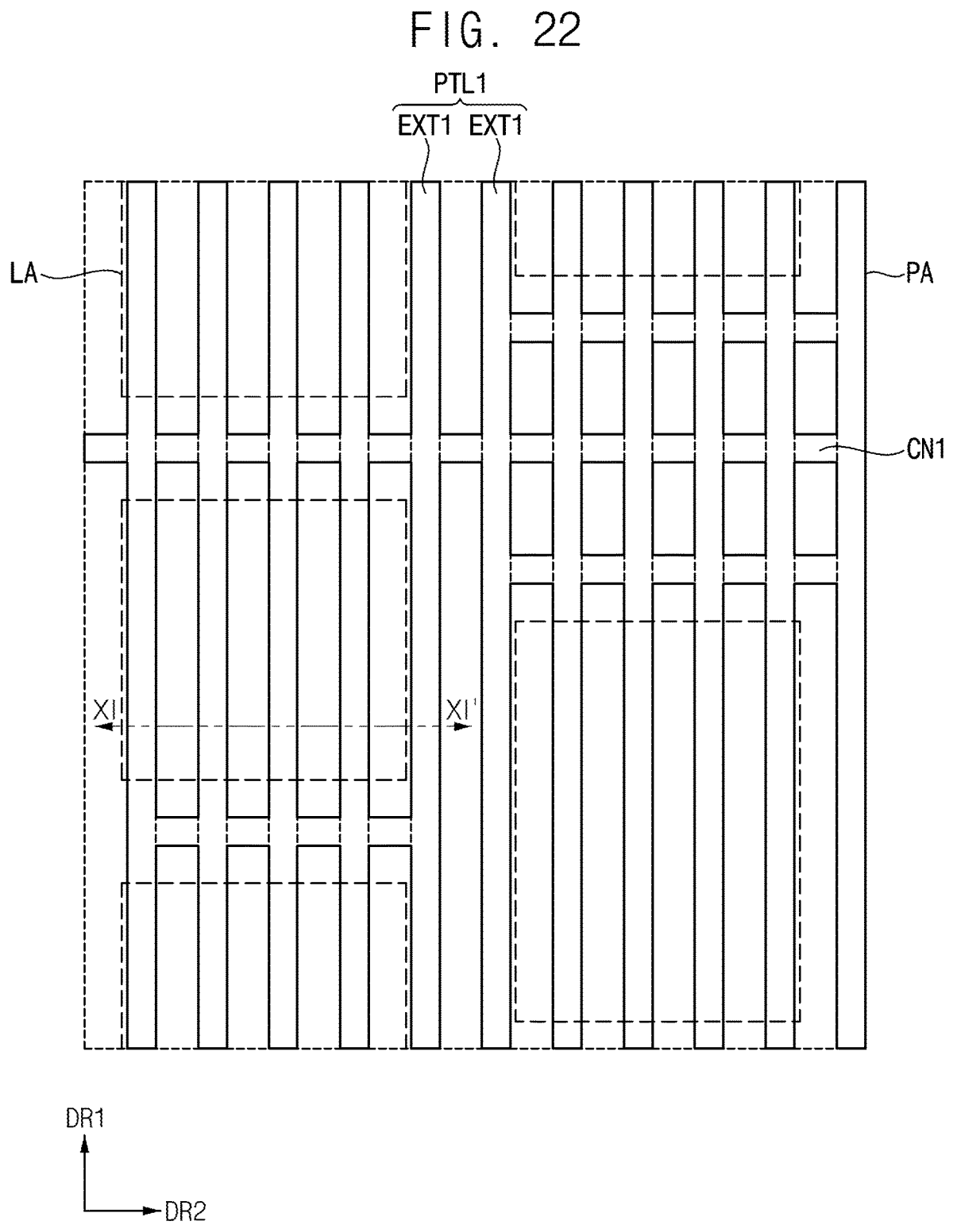
Figure 23:
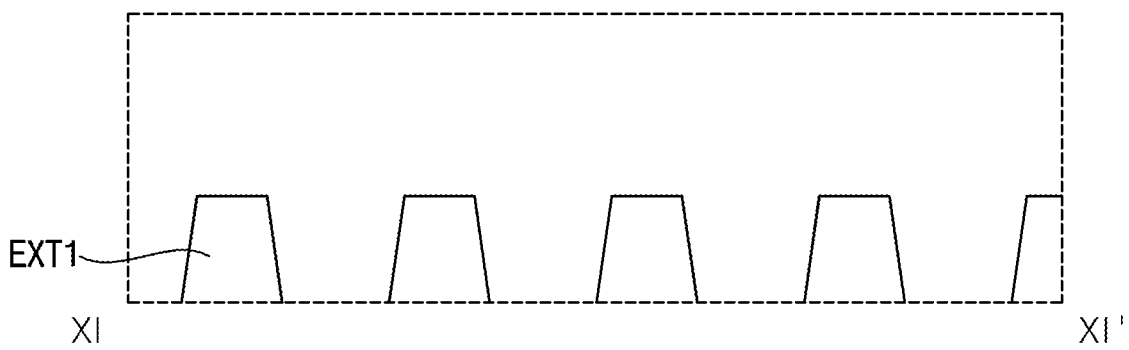

FIG. 23 is a cross-sectional view taken along line XI-XI' of FIG. 22.

Referring to FIGS. 22 and 23, the first pattern layer PTL1 may be patterned. The first pattern layer PTL1 may be patterned to form a plurality of first extension parts EXT1 and first connection parts CN1. The first extension parts EXT1 may extend in the first direction DR1. The first connection parts CN1 may extend in the second direction DR2 and may connect adjacent first extension parts EXT1 among the first extension parts EXT1 to each other. The first extension parts EXT1 may be formed in the light emitting areas LA and the peripheral area PA, and the first connection parts CN1 may be formed in the peripheral area PA.

Figure 24:
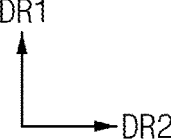
Figure 25:
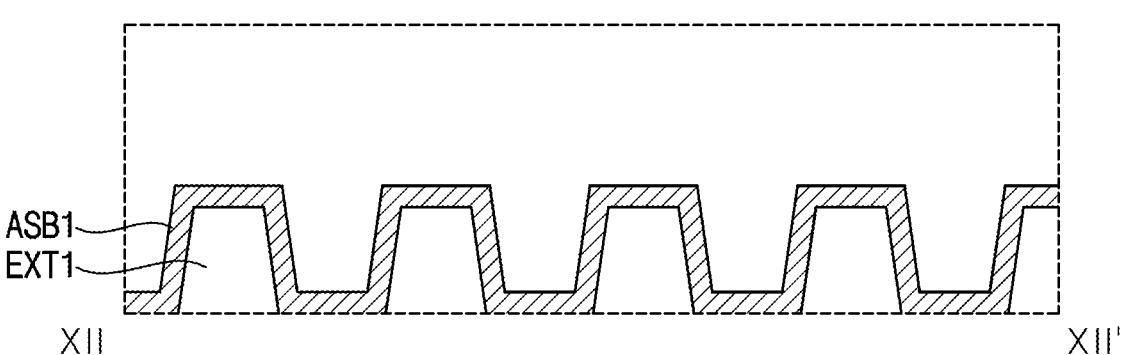

FIG. 25 is a cross-sectional view taken along line XII-XII' of FIG. 24.

Referring to FIGS. 24 and 25, a first light absorption film ASB1 may be formed on the first pattern layer PTL1. The first light absorption film ASB1 may be formed to cover the first pattern layer PTL1. The first light absorption film ASB1 may be formed of molybdenum-tantalum oxide (MTO). For example, the first light absorption film ASB1 may be formed of an MTO single layer structure. For another example, the first light absorption film ASB1 may have a double layer structure of at least one selected from the group consisting of MTO/Mo, MTO/Cu, and MTO/Al. For another example, the first light absorption film ASB may have a triple layer structure of at least one selected from the group consisting of MTO/Mo/MTO, MTO/Cu/MTO, and MTO/Al/MTO.

Figure 26:
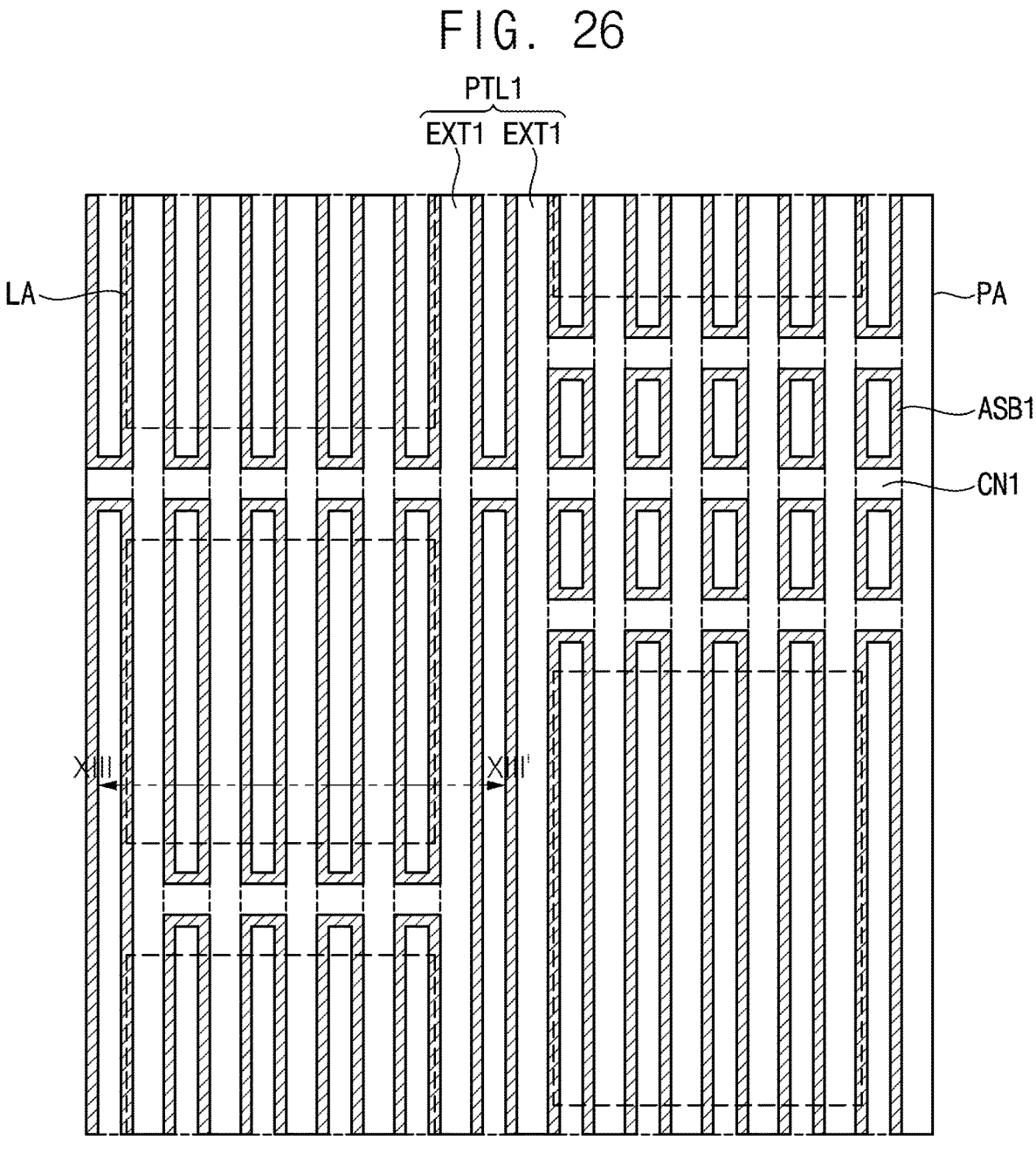
Figure 27:
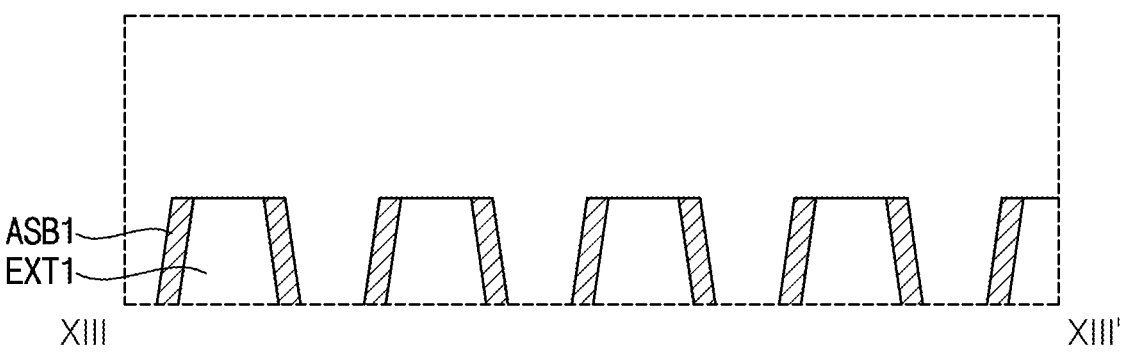

FIG. 27 is a cross-sectional view taken along line XIII-XIII' of FIG. 26.

Referring to FIGS. 26 and 27, the first light absorption film ASB1 may be front-side etched. That is, a portion of the first light absorption film ASB1 overlapping a top surface of the first pattern layer PTL1 may be etched through an etching process. Also, a portion of the first light absorption film ASB1 contacting the encapsulation layer 130 between the first extension parts EXT1 may be etched. Accordingly, the first light absorption film ASB1 may be formed to cover the side surface of the first pattern layer PTL1. That is, the first light absorption film ASB1 may cover side surfaces of the first extension parts EXT1 and the first connection parts CN1. In addition, the first light absorption film ASB1 may expose the top surface of the first pattern layer PTL.

Figure 28:
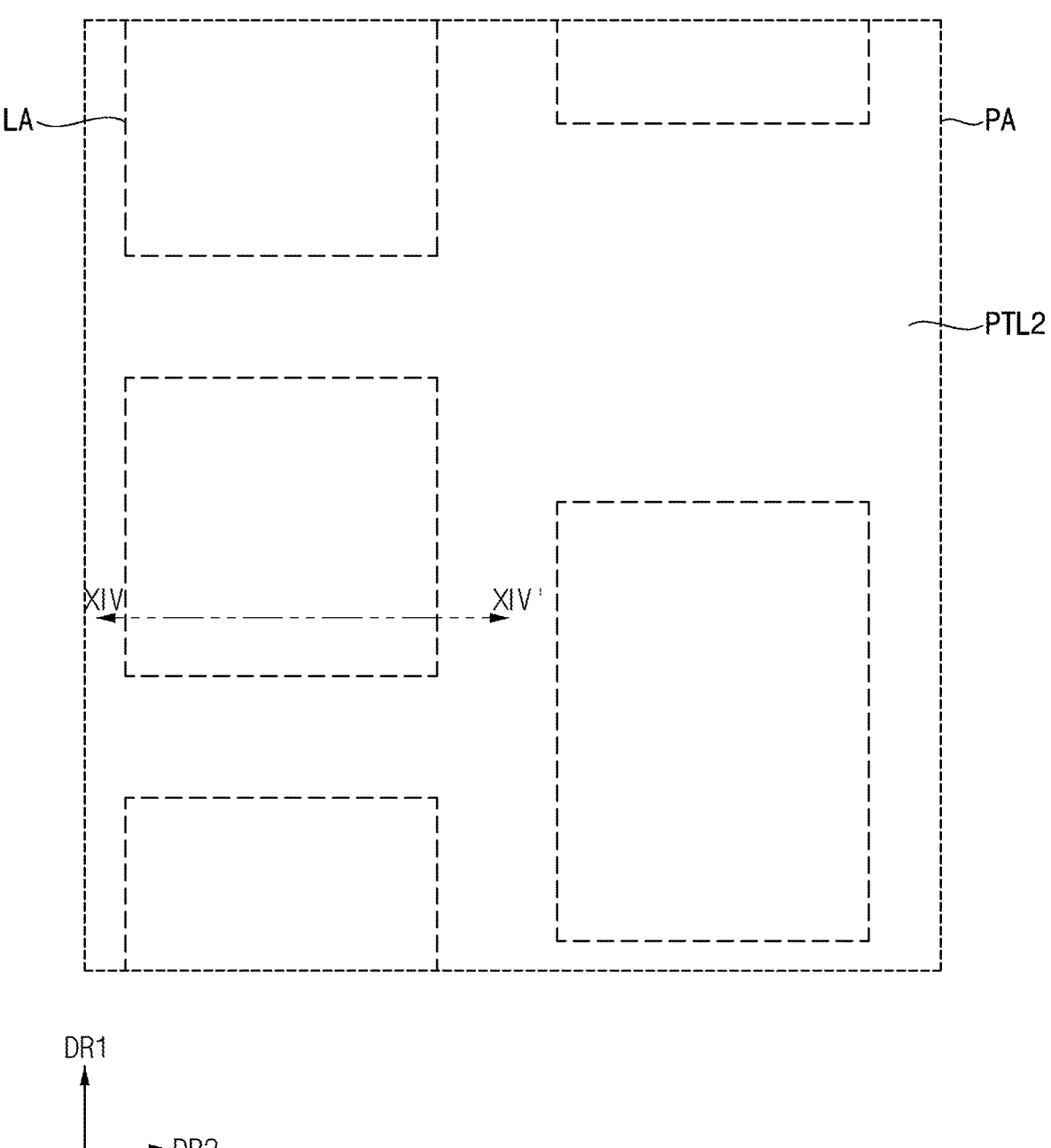
Figure 29:
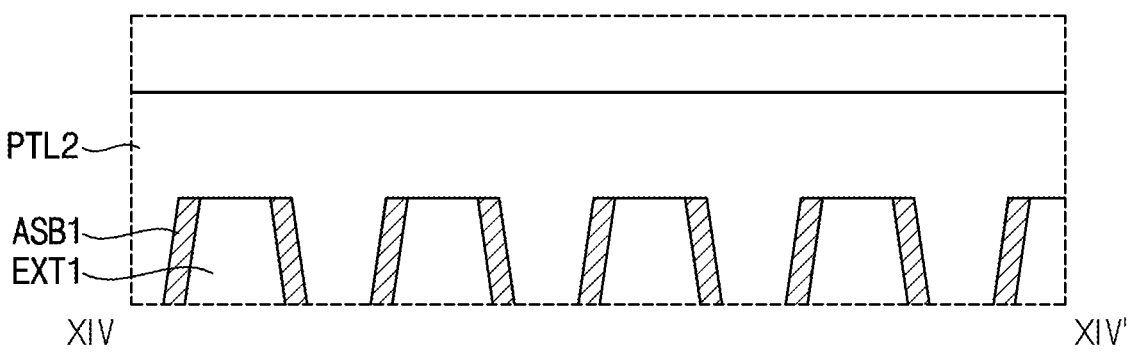

FIG. 29 is a cross-sectional view taken along line XIV-XIV' of FIG. 28.

Referring to FIGS. 28 and 29, a second pattern layer PTL2 may be formed on the first light absorption film ASB1 and the first pattern layer PTL1. For example, the second pattern layer PTL2 may be formed of at least one of an acrylic-based resin, methacrylic-based resin, a polyisoprene-based resin, a vinyl resin, an epoxy-based resin, an urethane-based resin, a cellulose-based resin, a siloxane-based resin, a polyimide-based resin, a polyamide-based resin and a perylene-based resin. The second pattern layer PTL2 may be entirely formed in the light emitting areas LA and the peripheral area PA.

Figure 30:
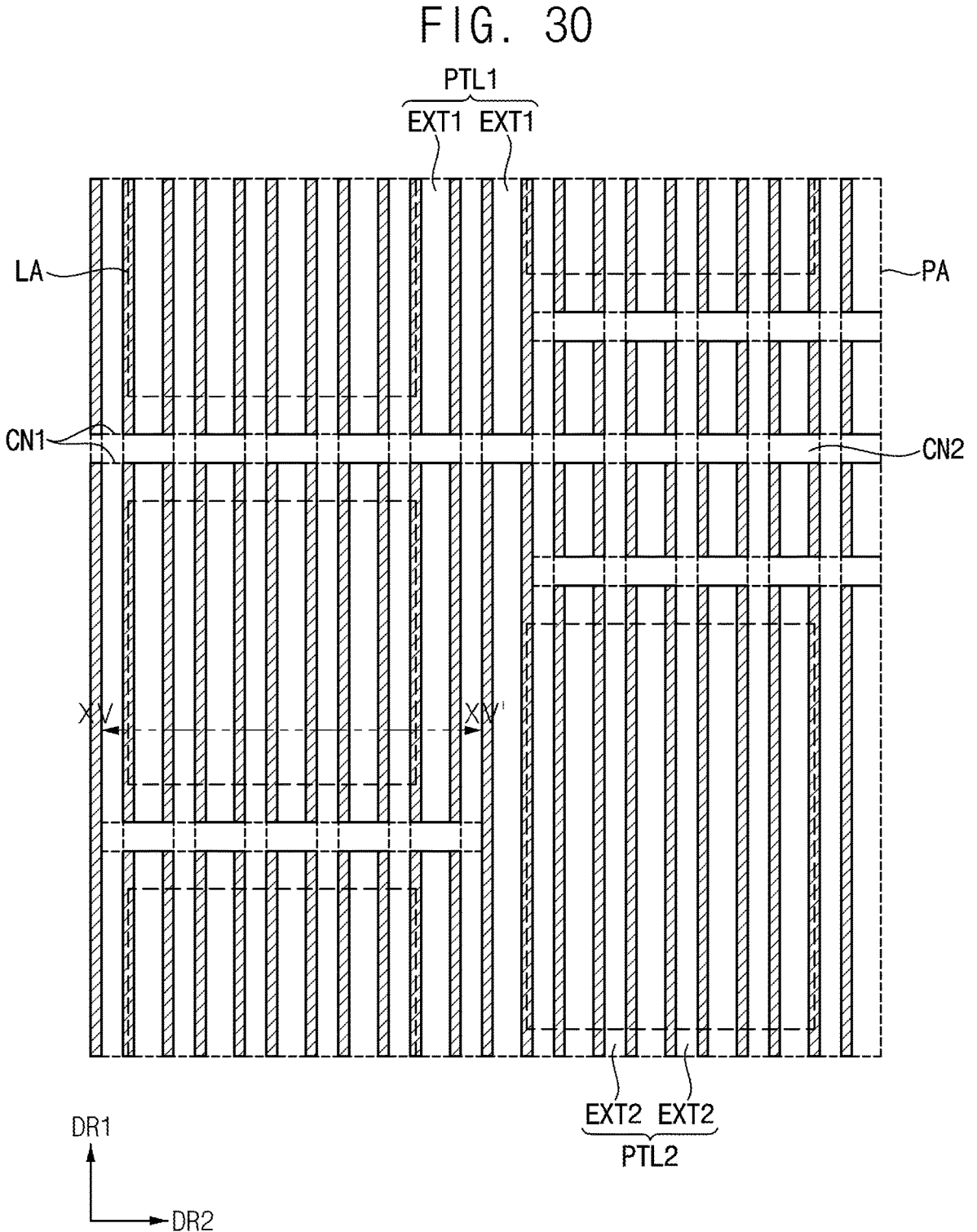
Figure 31:
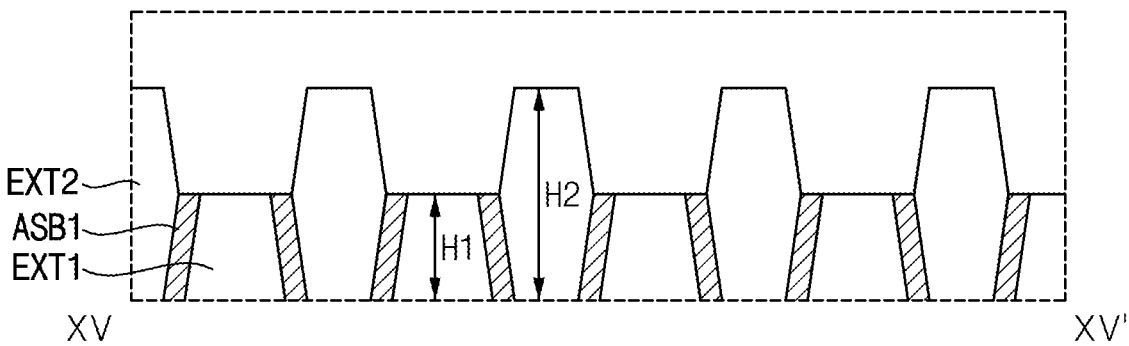

FIG. 31 is a cross-sectional view taken along line XV-XV' of FIG. 30.

Referring to FIGS. 30 and 31, the second pattern layer PTL2 may be patterned. The second pattern layer PTL2 may be patterned to form a plurality of second extension parts EXT2 and second connection parts CN2. The second extension parts EXT2 may extend in the first direction DR1. The second connection parts CN2 may extend in the second direction DR2 and may connect adjacent second extension parts EXT2 among the second extension parts EXT2 to each other. The second extension parts EXT2 may be formed in the light emitting areas LA and the peripheral area PA, and the second connection parts CN2 may be formed in the peripheral area PA.

The first extension parts EXT1 and the second extension parts EXT2 may be alternately disposed in a plan view. The height H2 of each of the second extension parts EXT2 may be greater than the height H1 of each of the first extension parts EXT1.

Also, the first connection parts CN1 and the second connection parts CN2 may be formed to overlap each other in the second direction DR2. However, the present disclosure is not limited thereto (see FIG. 9).

Figure 32:
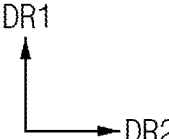
Figure 33:
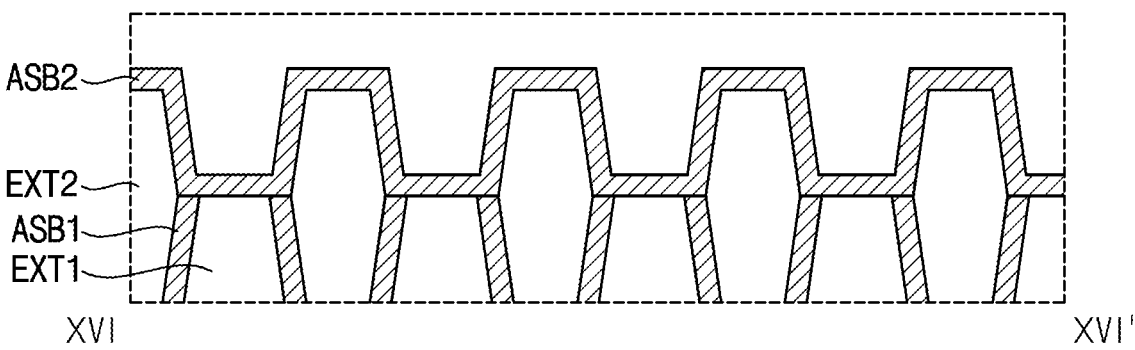

FIG. 33 is a cross-sectional view taken along line XVI-XVI' of FIG. 32.

Referring to FIGS. 32 and 33, a second light absorption film ASB2 may be formed on the second pattern layer PTL2. The second light absorption film ASB2 may be formed to cover the second pattern layer PTL2. The second light absorption film ASB2 may be formed of the same material as the first light absorption film ASB1. However, the present disclosure is not limited thereto.

Figure 34:
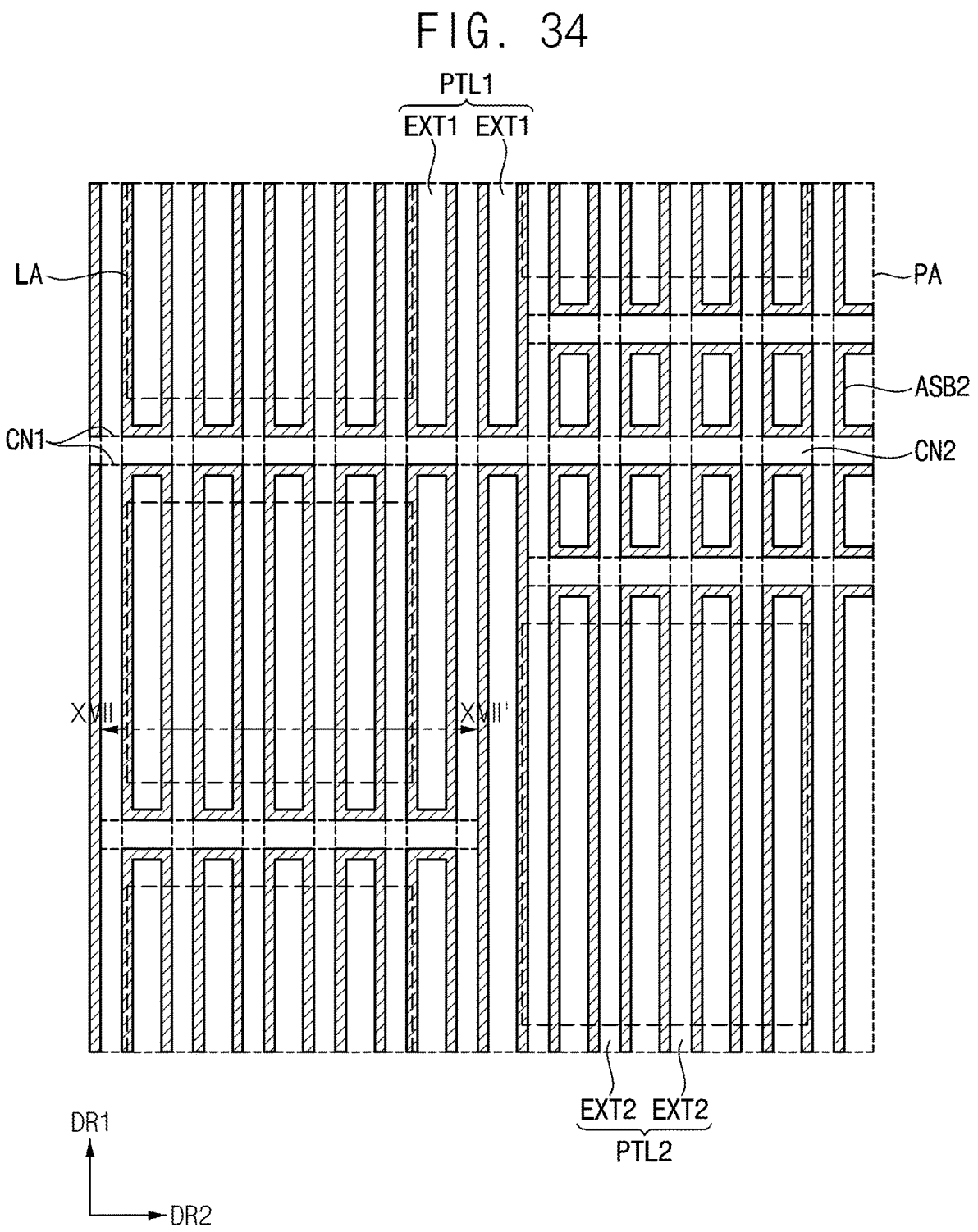
Figure 35:
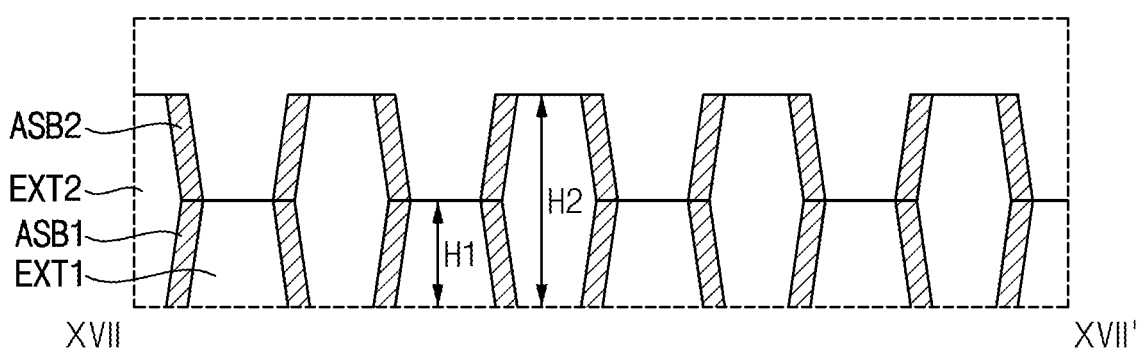

FIG. 35 is a cross-sectional view taken along line XVII-XVII' of FIG. 34.

Referring to FIGS. 34 and 35, the second light absorption film ASB2 may be front-side etched. A portion of the second light absorption film ASB2 overlapping a top surface of the second pattern layer PTL2 may be etched. Also, a portion of the second light absorption film ASB2 overlapping the top surface of the first pattern layer PTL1 may be etched. Accordingly, the second light absorption film ASB2 may be formed to cover the side surface of the second pattern layer PTL2. That is, the second light absorption film ASB2 may cover side surfaces of the second extension parts EXT2 and the second connection parts CN2. The second light absorption film ASB2 may expose the top surface of the second pattern layer PTL2.

The first light absorption film ASB1 and the second light absorption film ASB2 may form a light absorption film ASB.

Figure 36:
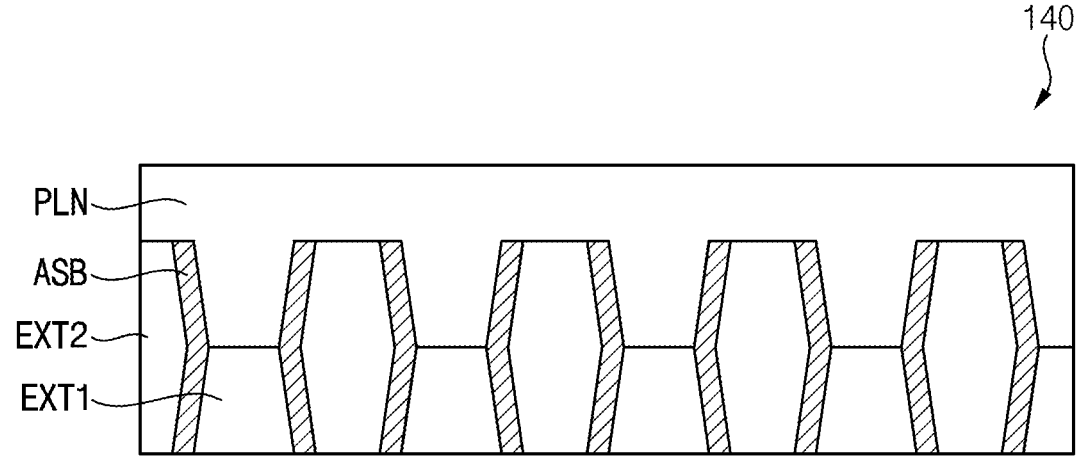

Referring further to FIG. 36, a planarization film PLN may be formed on the first pattern layer PTL1, the second pattern layer PTL2, and the light absorption film ASB. The planarization film PLN may cover the first pattern layer PTL1, the second pattern layer PTL2, and the light absorption film ASB. The planarization film PLN may be formed of an organic material.

FIGS. 37 to 40 are views illustrating a method of manufacturing a light control layer according to an embodiment of the present disclosure.

For example, a method of manufacturing a light control layer described with reference to FIGS. 37 to 40 may be a method of manufacturing the light control layer 142 described with reference to FIGS. 12 to 15.

Figure 37:
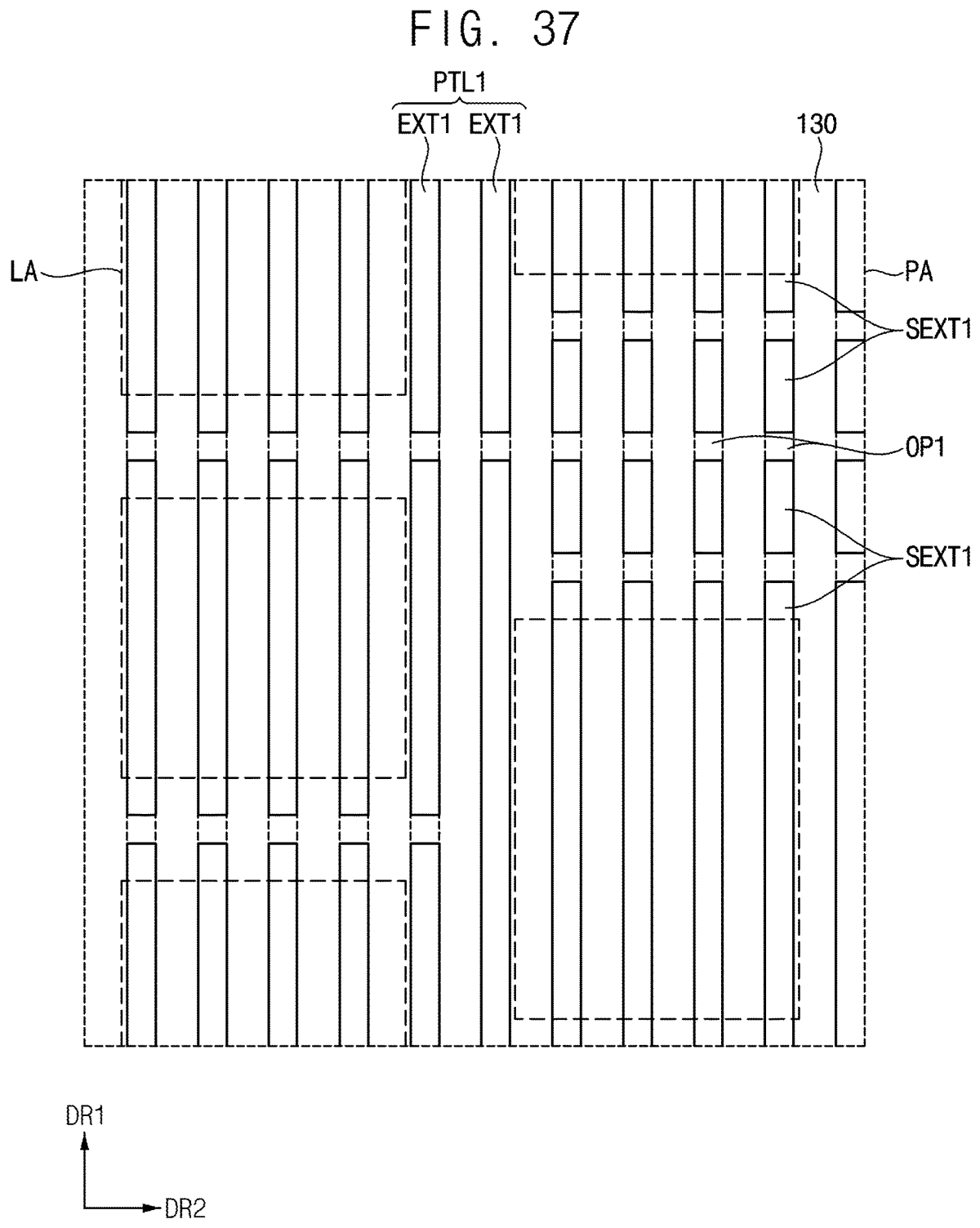

Referring to FIG. 37, a first pattern layer PTL1 may be formed on the encapsulation layer 130. The first pattern layer PTL1 may be formed of at least one of an acrylic-based resin, a methacrylic-based resin, a polyisoprene-based resin, a vinyl-based resin, an epoxy-based resin, an urethane-based resin, a cellulose-based resin, a siloxane-based resin, a polyimide-based resin, a polyamide-based resin, and a perylene-based resin. The first pattern layer PTL1 may be entirely formed in the light emitting areas LA and the peripheral area PA.

The first pattern layer PTL1 may be patterned to form first extension parts EXT1 and first openings OP1. At least one first opening OP1 may be formed in each of the first extension parts EXT1. The first openings OP1 may be formed in the peripheral area PA. As the first opening OP1 is formed, the first extension parts EXT1 may form a plurality of first sub-extension parts SEXT1 spaced apart from each other.

Further referring to FIG. 38, a first light absorption film ASB1 may be formed on the first pattern layer PTL1. The first light absorption film ASB1 may be formed to cover the first pattern layer PTL1. The first light absorption film ASB1 may be formed of molybdenum-tantalum oxide (MTO).

Thereafter, the first light absorption film ASB1 may be front-side etched. A portion of the first light absorption film ASB1 overlapping a top surface of the first pattern layer PTL1 may be etched. Also, a portion of the first light absorption film ASB1 contacting the encapsulation layer 130 between the first extension parts EXT1 may be etched. Also, portions of the first light absorption film ASB1 overlapping the first openings OP1 may be etched. Accordingly, the first light absorption film ASB1 may be formed to cover side surfaces of the first sub-extension parts SEXT1. That is, the first light absorption film ASB1 may cover only the side surfaces of the first sub-extension parts SEXT1 and may expose top surfaces of the first sub-extension parts SEXT1.

Figure 39:
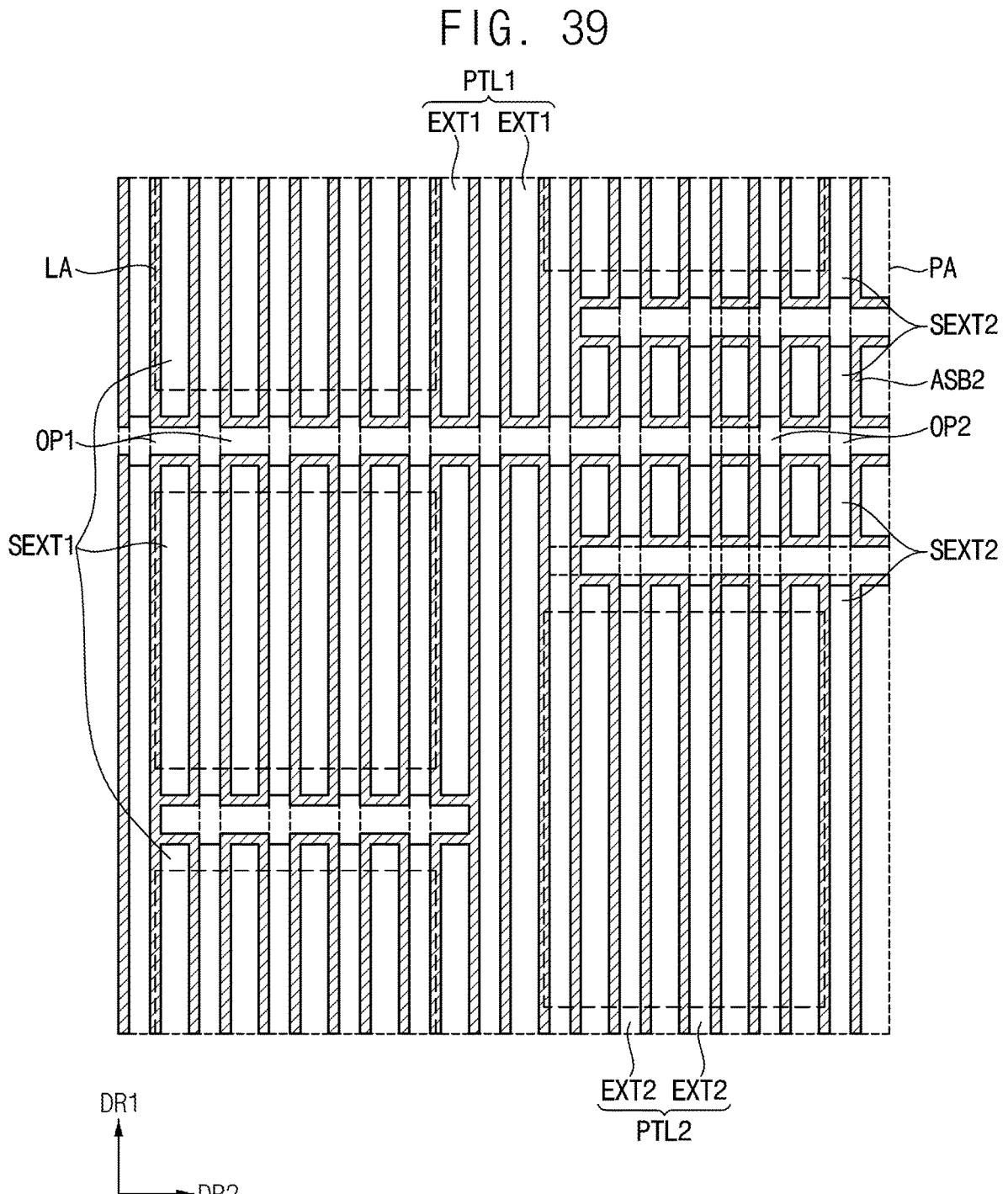
Figure 40:
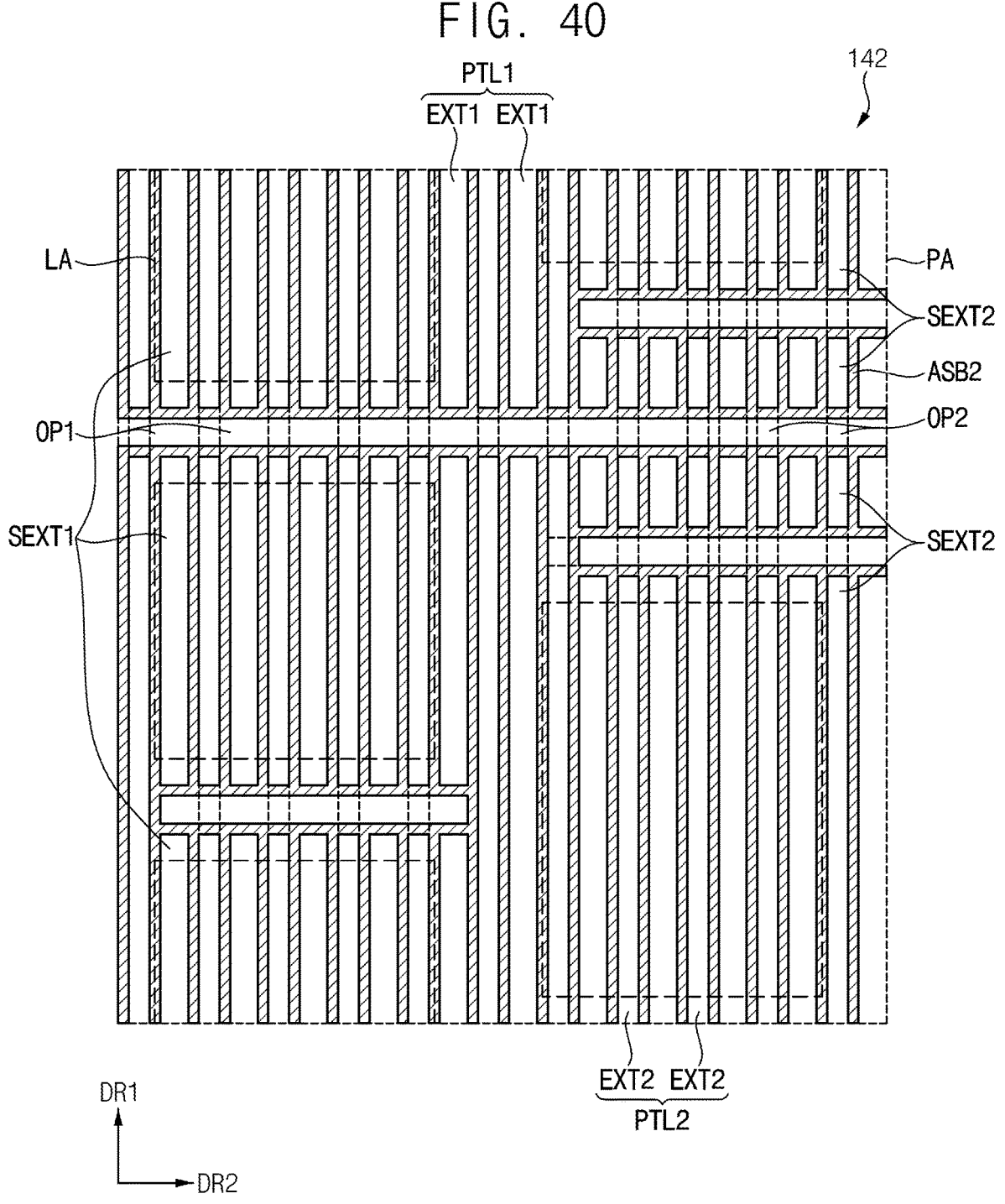

Referring further to FIG. 39, a second pattern layer PTL2 may be formed on the first light absorption film ASB1 and the first pattern layer PTL1. The second pattern layer PTL2 may be formed of at least one of an acrylic-based resin, a methacrylic-based resin, a polyisoprene-based resin, a vinyl-based resin, an epoxy-based resin, an urethane-based resin, a cellulose-based resin, a siloxane-based resin, a polyimide-based resin, a polyamide-based resin, and a perylene-based resin. The second pattern layer PTL2 may be entirely formed in the light emitting areas LA and the peripheral area PA.

The second pattern layer PTL2 may be patterned. The second pattern layer PTL2 may be patterned to form second extension parts EXT2 and second openings OP2. At least one second opening OP2 may be formed in each of the second extension parts EXT2. The second openings OP2 may be formed in the peripheral area PA. As the second opening OP2 is formed, the second extension parts EXT2 may form a plurality of second sub-extension parts SEXT2 spaced apart from each other.

Also, the first openings OP1 and the second openings OP2 may be formed to overlap each other in the second direction DR2. However, the present disclosure is not limited thereto (see FIG. 16).

A second light absorption film ASB2 may be formed on the second pattern layer PTL2. The second light absorption film ASB2 may be formed to cover the second pattern layer PTL2.

The second light absorption film ASB2 may be front-side etched. A portion of the second light absorption film ASB2 overlapping a top surface of the second pattern layer PTL2 may be etched. Also, a portion of the second light absorption film ASB2 overlapping the top surface of the first pattern layer PTL1 may be etched. Also, portions of the second light absorption film ASB2 overlapping the second openings OP2 may be etched. Accordingly, the second light absorption film ASB2 may be formed to cover side surfaces of the second sub-extension parts SEXT2. That is, the second light absorption film ASB2 may cover only the side surfaces of the second sub-extension parts SEXT2 and may expose the top surfaces of the second sub-extension parts SEXT2 (see FIG. 40).

A planarization film PLN may be formed on the first pattern layer PTL1, the second pattern layer PTL2, and the second light absorption film ASB2. The planarization film PLN may cover the first pattern layer PTL1, the second pattern layer PTL2, and the second light absorption film ASB2.

Although this specification has been described based on a vehicle display device, the present disclosure is not limited thereto, and embodiments according to the present disclosure may be applied to a computer, a laptop, a notebook, a mobile phone, a smartphone, a smart pad, a portable multimedia player (PMP), a personal digital assistant (PDA), an MP3 player, or the like.

While the present disclosure has been described with reference to embodiments thereof, it will be apparent to those of ordinary skill in the art that various changes and modifications may be made thereto without departing from the scope and spirit of the present disclosure as set forth in the claims.

What is claimed is:

1. A display device comprising:
a substrate including light emitting areas and a peripheral area surrounding the light emitting areas;
a light emitting element layer disposed on the substrate and overlapping the light emitting areas;
an encapsulation layer disposed on the light emitting element layer;
a first pattern layer disposed on the encapsulation layer, and including first extension parts extending in a first direction and first connection parts connecting adjacent first extension parts among the first extension parts to each other; and
a second pattern layer disposed on the encapsulation layer and adjacent to the first pattern layer,
wherein the second pattern layer includes second extension parts disposed between the first extension parts and extending in the first direction and second connection parts connecting adjacent second extension parts among the second extension parts to each other, and
wherein a height of each of the second extension parts is greater than a height of each of the first extension parts.

2. The display device of claim 1, wherein the first connection parts are spaced apart from the light emitting areas in a plan view and disposed in the peripheral area.

3. The display device of claim 1, wherein the first extension parts and the first connection parts are disposed on the same layer and integrally formed.

4. The display device of claim 1, wherein the first connection parts extend in a second direction crossing the first direction.

5. The display device of claim 1, wherein in a plan view, the first extension parts and the second extension parts are alternately disposed.

6. The display device of claim 1, wherein the second extension parts and the second connection parts are disposed on the same layer and integrally formed.

7. The display device of claim 1, wherein the second extension parts respectively cover the first connection parts and respectively overlap the first connection parts.

8. The display device of claim 1, wherein the second connection parts are respectively disposed on the first extension parts and respectively overlap the first extension parts.

9. The display device of claim 1, wherein the second connection parts are disposed in the peripheral area and extend in a second direction crossing the first direction.

10. The display device of claim 9, wherein the first connection parts and the second connection parts overlap each other in the second direction.

11. The display device of claim 1, further comprising:

a light absorption film covering a side surface of each of the first extension parts and the second extension parts.

12. The display device of claim 11, wherein the light absorption film covers side surfaces of the first connection parts and the second connection parts.

13. The display device of claim 11, wherein the light absorption film includes molybdenum-tantalum oxide (MTO).

14. The display device of claim 1, wherein the first pattern layer is formed of at least one of an acrylic-based resin, a methacrylic-based resin, a polyisoprene-based resin, a vinyl-based resin, an epoxy-based resin, an urethane-based resin, a cellulose-based resin, a siloxane-based resin, a polyimide-based resin, a polyamide-based resin, or a perylene-based resin.

15. A display device comprising:

a substrate including light emitting areas and a peripheral area surrounding the light emitting areas;

a light emitting element layer disposed on the substrate and overlapping the light emitting areas;

an encapsulation layer disposed on the light emitting element layer;

a first pattern layer disposed on the encapsulation layer, and including first extension parts extending in a first direction and first connection parts connecting adjacent first extension parts among the first extension parts to each other; and a second pattern layer disposed on the encapsulation layer and adjacent to the first pattern layer, wherein the second pattern layer includes second extension parts disposed between the first extension parts and extending in the first direction and second connection parts connecting adjacent second extension parts among the second extension parts to each other, wherein the second connection parts are disposed in the peripheral area and extend in a second direction crossing the first direction, and wherein the first connection parts and the second connection parts are alternately disposed along the second direction.

* * * * *